United States Patent
Fujiwara et al.

(10) Patent No.: US 7,257,066 B2
(45) Date of Patent: Aug. 14, 2007

(54) DATA DEFECT DETECTION USING SOFT DECISION RESULT

(75) Inventors: Toru Fujiwara, Kato (JP); Masakazu Taguchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 430 days.

(21) Appl. No.: 09/956,080

(22) Filed: Sep. 20, 2001

(65) Prior Publication Data

US 2003/0026185 A1    Feb. 6, 2003

(30) Foreign Application Priority Data

May 31, 2001    (JP) ............................... 2001-165590

(51) Int. Cl.
    *G11B 7/005*    (2006.01)
(52) U.S. Cl. ................................ 369/53.15; 369/59.22; 714/794
(58) Field of Classification Search ............. 369/53.15, 369/47.14, 59.22
    See application file for complete search history.

(56) References Cited

U.S. PATENT DOCUMENTS

| | | | |
|---|---|---|---|
| 4,750,058 A * | 6/1988 | Hirt et al. ..................... 360/46 |
| 5,748,593 A * | 5/1998 | Tanaka et al. ............ 369/59.19 |
| 6,185,175 B1 * | 2/2001 | Zook ........................ 369/53.35 |
| 6,269,124 B1 * | 7/2001 | Nagayasu et al. .......... 375/262 |
| 6,289,059 B1 * | 9/2001 | Yamaguchi et al. ........ 375/341 |
| 6,452,985 B1 * | 9/2002 | Hatakeyama et al. ....... 375/341 |
| 6,581,182 B1 * | 6/2003 | Lee ............................. 714/795 |
| 6,625,179 B1 * | 9/2003 | Doetsch et al. ............. 370/529 |
| 6,694,477 B1 * | 2/2004 | Lee ............................. 714/784 |
| 6,708,308 B2 * | 3/2004 | De Souza et al. .......... 714/795 |

FOREIGN PATENT DOCUMENTS

| | | |
|---|---|---|
| JP | 6-325504 | 11/1994 |
| JP | 10-055628 | 2/1998 |
| JP | 10-308066 | 11/1998 |
| JP | 10-312640 | 11/1998 |
| JP | 2000-331429 | 11/2000 |

* cited by examiner

*Primary Examiner*—Andrea Wellington
*Assistant Examiner*—Michael V. Battaglia
(74) *Attorney, Agent, or Firm*—Staas & Halsey LLP

(57) ABSTRACT

A defect detection device for detecting a defect of data recorded on a recording medium includes a waveform state detection part generating information representing a state of a waveform of a reproduced signal from the recording medium based on soft decision results obtained in process of reproducing the data in accordance with a maximum likelihood decoding algorithm corresponding to partial response, and a defect determination part determining the defect of the recorded data based on the information generated in said waveform state detection part.

45 Claims, 23 Drawing Sheets

FIG.2

| CONDITION | (1) (EXPRESSION 11) (EXPRESSION 13) | PATH MEMORY | (2) (EXPRESSION 11) (EXPRESSION 14) | PATH MEMORY | (3) (EXPRESSION 12) (EXPRESSION 13) | PATH MEMORY | (4) (EXPRESSION 12) (EXPRESSION 14) | PATH MEMORY |
|---|---|---|---|---|---|---|---|---|
| TRELLIS | S3 S2 S1 S0 | OD3=0 OD2=0 OD1=1 OD0=0 | S3 S2 S1 S0 | OD3=1 OD2=0 OD1=1 OD0=0 | S3 S2 S1 S0 | OD3=0 OD2=0 OD1=1 OD0=1 | S3 S2 S1 S0 | OD3=1 OD2=0 OD1=1 OD0=1 |

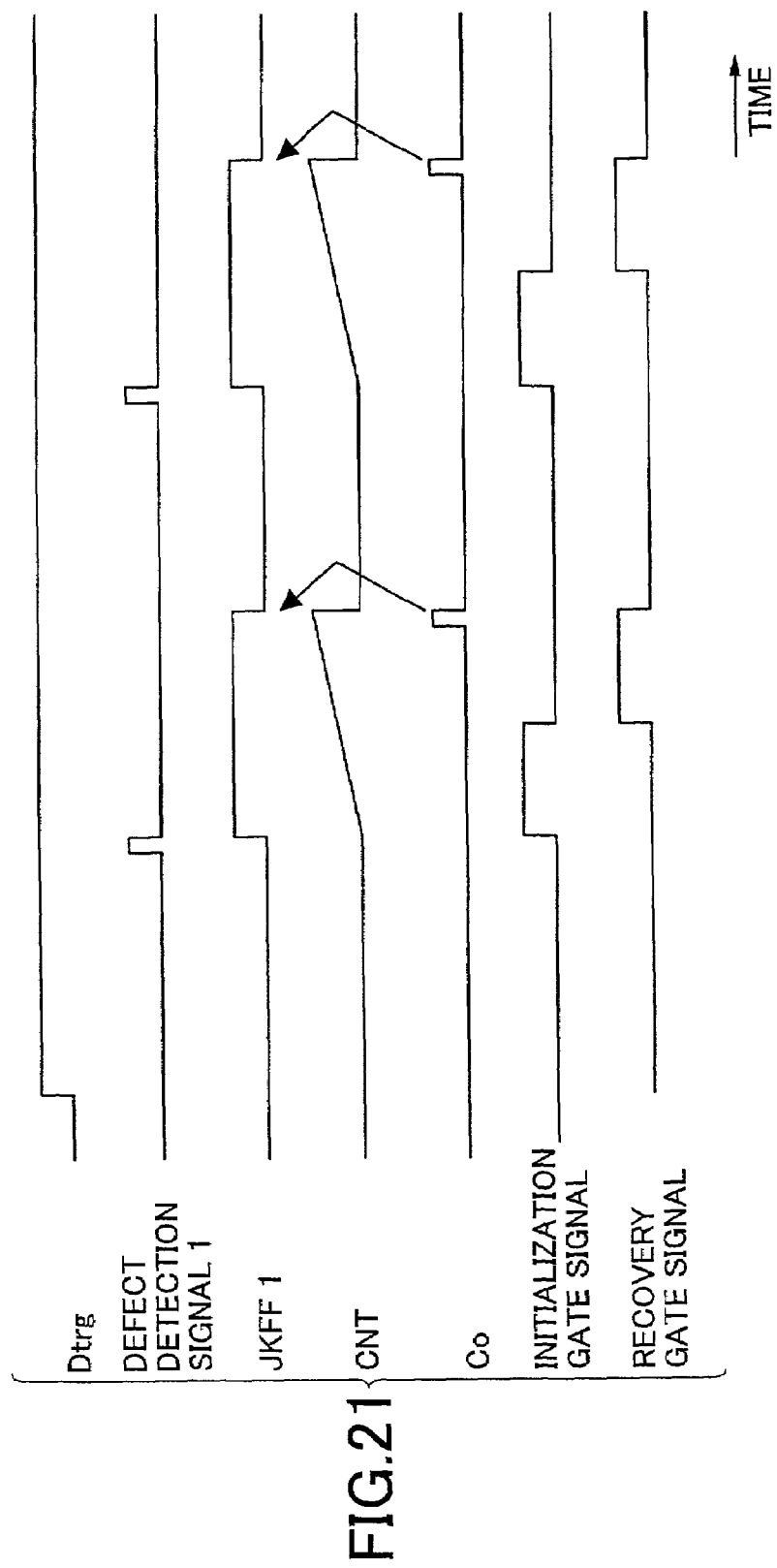

DATA DEFECT DETECTION USING SOFT DECISION RESULT

BACKGROUND OF THE INVENTION

1. Field of the Invention

The present invention generally relates to data defect detection using soft decision result, and more particularly to a defect detection device for a data reproduction apparatus such as an optical disk unit or a magnetic disk unit, the defect detection device detecting a defect of recorded data based on a reproduced signal from a recording medium and a data reproduction apparatus including the same. The present invention also relates more particularly to a data defect detection method based on a reproduced signal from a recording medium and a data reproduction method based on such a data defect detection method.

2. Description of the Related Art

Recently, as information is recorded on a recording medium such as a magneto-optical disk at a higher density, more efforts have been made to increase a data transfer rate in the reproduction system of the magneto-optical disk. As a method of performing high-speed information reproduction with high accuracy from such a magneto-optical disk recorded with information at high density, a recording and reproduction method according to PRML (Partial Response Maximum Likelihood) is proposed.

According to this PRML recording and reproduction method, a magneto-optical disk is recorded with a signal with a partial response (PR) waveform, and a reproduced signal from the magneto-optical disk is sampled in synchronism with a predetermined clock signal so as to obtain sampled values. Data having maximum likelihood is reproduced from the sampled values (quantized data) in accordance with a maximum likelihood (ML) algorithm such as the Viterbi decoding algorithm.

With respect to a data reproduction apparatus based on the above-described PRML recording and reproduction method, such as a magneto-optical disk unit, it is proposed to detect a variation in the direct current level of the reproduced signal and feed back the variation level to information for data demodulation, such as expected values or sampled values employed for maximum likelihood decoding. Thereby, data is reproducible with high accuracy from sampled values of a reproduced signal even if the reproduced signal varies in its direct current level.

In such a data reproduction apparatus as described above, if recorded data includes a defect resulting from a physical defect of a recording medium, such as a flaw or adhesion of dust, or from a defective operation in writing the data to the recording medium, the data is prevented from being properly reproduced from sampled values of a reproduced signal affected by such a defect. Therefore, it is important to detect such a defect of the recorded data.

Further, in a data reproduction apparatus in which the level variation of a reproduced signal is fed back to information used for data demodulation, it becomes an issue how to control the feedback of the variation level to the information for data demodulation in a defect-containing part and the other normal part of recorded data.

SUMMARY OF THE INVENTION

It is a general object of the present invention to provide a defect detection device that can accurately detect a defect of data recorded on a recording medium and a data reproduction apparatus including such a defect detection device.

It is another general object of the present invention to provide a defect detection method that can accurately detect a defect of data recorded on a recording medium and a data reproduction method based on such a defect detection method.

A more specific object of the present invention is to provide a defect detection device that detects a defect of data recorded on a recording medium based on soft decision results obtained in process of reproducing the data in accordance with a maximum likelihood decoding algorithm corresponding to partial response and a data reproduction apparatus including such a defect detection device.

Yet another more specific object of the present invention is to provide a defect detection method by which a defect of data recorded on a recording medium is detected based on soft decision results obtained in process of reproducing the data in accordance with a maximum likelihood decoding algorithm corresponding to partial response and a data reproduction method based on such a defect detection method.

The above objects of the present invention are achieved by a defect detection device for detecting a defect of recorded data in a data reproduction apparatus for reproducing data having maximum likelihood as the recorded data in accordance with a maximum likelihood decoding algorithm corresponding to partial response, the data being reproduced from sampled values obtained by sampling a reproduced signal from a recording medium, the defect detection device including a waveform state detection part generating information representing a state of a waveform of the reproduced signal based on soft decision results obtained in process of reproducing the data and a defect determination part determining the defect of the recorded data based on the information generated in the waveform state detection part.

The above objects of the present invention are also achieved by a defect detection device for detecting a defect of data recorded on a recording medium, the defect detection device including a first part generating information representing a state of a waveform of a reproduced signal from the recording medium based on soft decision results obtained in process of reproducing the data in accordance with a maximum likelihood decoding algorithm corresponding to partial response and a second part determining the defect of the recorded data based on the information generated in the first part.

The above objects of the present invention are also achieved by a method of detecting a defect of data recorded on a recording medium, the method including the steps of (a) obtaining soft decision results obtained in process of reproducing the data in accordance with a maximum likelihood decoding algorithm corresponding to partial response, (b) generating information representing a state of a waveform of a reproduced signal from the recording medium based on the soft decision results obtained in the step (a), and (c) determining the defect of the recorded data based on the information obtained in the step (b).

According to the above-described devices and method, soft decision results obtained in process of reproducing data having maximum likelihood in accordance with a maximum likelihood decoding algorithm represent possible state transition of data obtained based on sampled values of a reproduced signal. Therefore, the soft decision results reflect the state of a waveform of the reproduced signal. Since a defect of recorded data appears as an abnormality in the reproduced signal, the defect of the recorded data is determinable based on the soft decision results.

The above object of the present invention are also achieved by a data reproduction apparatus for reproducing data having maximum likelihood as recorded data in accordance with a maximum likelihood decoding algorithm corresponding to partial response, the data being reproduced from sampled values obtained by sampling a reproduced signal from a recording medium, the data reproduction apparatus including: a follow-up control part controlling, based on a level of a variation in the reproduced signal, necessary information for reproducing the data so that the necessary information follows the variation in the reproduced signal; a defect detection part for detecting a defect of the recorded data; and an initialization part fixing the necessary information to an initial value for a given period of time when the defect detection part detects the defect of the recorded data, wherein the defect detection part includes a waveform state detection part generating information representing a state of a waveform of the reproduced signal based on soft decision results obtained in process of reproducing the data and a defect determination part determining the defect of the recorded data based on the information generated in the waveform state detection part.

According to the above-described apparatus, when a defect of recorded data is detected, necessary information for reproducing the recorded data is fixed to an initial value for a given period of time. Therefore, the necessary information is prevented from following a variation in a reproduced signal which variation corresponds to the defect of the recorded data.

The above objects of the present invention are also achieved by a data reproduction apparatus including a defect detection part detecting a defect of data recorded on a recording medium, the defect detection part including a first part generating information representing a state of a waveform of a reproduced signal from the recording medium based on soft decision results obtained in process of reproducing the data in accordance with a maximum likelihood decoding algorithm corresponding to partial response and a second part determining the defect of the recorded data based on the information generated in the first part.

Additionally, the above-described apparatus may include a control part controlling, based on a level of a variation in the reproduced signal, necessary information for reproducing the data so that the necessary information follows the variation in the reproduced signal and an initialization part fixing the necessary information to an initial value for a given period of time when the defect detection part detects the defect of the recorded data.

According to this data reproduction apparatus, the same effects as described above can be produced.

The above objects of the present invention are further achieved by a method of reproducing data from a recording medium, including the steps of (a) detecting a defect of data recorded on a recording medium; (b) fixing necessary information for reproducing the data to an initial value for a given period of time when the step (a) detects the defect of the recorded data, and (c) controlling the necessary information based on a level of a variation in the reproduced signal so that the necessary information follows the variation in the reproduced signal.

According to the above-described method, the same effects as described above can be produced.

BRIEF DESCRIPTION OF THE DRAWINGS

Other objects, features and advantages of the present invention will become more apparent from the following detailed description when read in conjunction with the accompanying drawings, in which:

FIG. 2 is a diagram showing patterns of state transition considered in a maximum likelihood detector of the data reproduction apparatus of FIG. 1;

FIG. 21 is a timing chart of signals for illustrating an operation of the recovery gate signal generator of FIG. 20.

DETAILED DESCRIPTION OF THE PREFERRED EMBODIMENTS

A description will now be given, with reference to the accompanying drawings, of an embodiment of the present invention.

Figure 1:
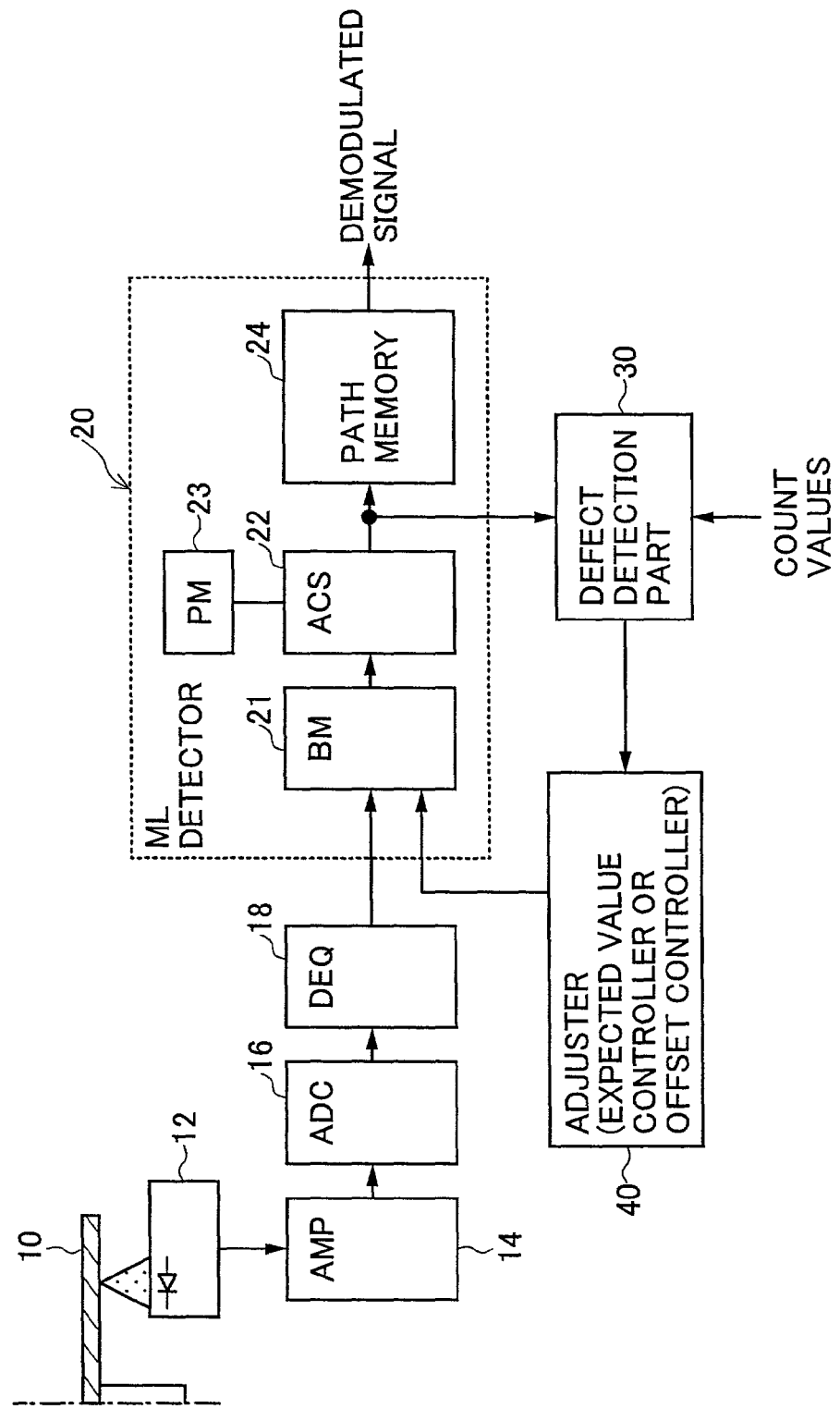
FIG. 1 is a block diagram showing a structure of a data reproduction apparatus according to an embodiment of the present invention.

FIG. 1 is a block diagram showing a structure of a data reproduction apparatus according to the embodiment of the present invention. The data reproduction apparatus is included in an optical-disk unit using a magneto-optical disk (MO) as a recording medium.

According to FIG. 1, the data reproduction apparatus includes an optical head 12 for optically reading data from a magneto-optical disk 10 and outputting an electrical signal, a head amplifier (AMP) 14 for amplifying the output signal of the optical head 12, an analog-to-digital converter (ADC) 16, a digital equalizer (DEQ) 18, and a maximum likelihood (ML) detector 20. The output signal of the head amplifier 14 is supplied to the ADC 16 as a reproduced signal. Normally, a low-pass filter (LPF), which is not shown in the drawing, is provided between the head amplifier 14 and the ADC 16 to eliminate an aliasing noise. The ADC 16 performs A/D conversion on the reproduced signal in synchronism with a given clock signal generated in a clock generation circuit (not shown in the drawing) and outputs values obtained from the reproduced signal by the A/D conversion as sampled values (quantized data). That is, the reproduced signal is sampled in synchronism with the clock signal in the ADC 16. The DEQ 18 performs an equalization operation of a partial response (PR) waveform such as a PR(1,1) waveform on the sampled values supplied from the ADC 16 and outputs the waveform-equalized sampled values Yt.

The data reproduction apparatus further includes a defect detection part 30 and an adjuster (expected value controller or offset controller) 40 (a follow-up control part). The defect detection part 30, as later described, detects a variety of defects of recorded data based on a soft decision output of the ML detector 20. The adjuster 40 detects the level of a variation in the reproduced signal and controls expected values, which are one type of information used for data demodulation in the ML detector 20, based on the variation level so that the expected values vary to follow the variation in the reproduced signal. In this case, the adjuster 40 serves as the expected value controller and its operation may be referred to as follow-up control of the expected values. The adjuster may also control an offset amount for the expected values determined by the PR waveform based on the variation level of the reproduced signal so that the offset amount follows the variation in the reproduced signal. In this case, the adjuster serves as the offset controller and its operation may be referred to as follow-up control of the offset amount.

The adjuster 40 may control the sampled values Yt, which are another type of the information used for the data demodulation in the ML detector 20, based on the variation level of the reproduced signal so that the sampled values Yt follow the variation in the reproduced signal.

The ML detector 20 reproduces data having maximum likelihood as the recorded data from the sampled values Yt supplied from the DEQ 18 in accordance with a maximum likelihood decoding algorithm such as the Viterbi decoding algorithm. The ML detector 20 includes a branch metric calculation unit (hereinafter referred to as a BM calculation unit) 21, an add-compare-select unit (hereinafter referred to as an ACS unit) 22, a path metric memory (PMM) 23, and a path memory 24.

A description will be given more specifically of the ML detector 20 with reference to the case of the reproduced signal with a PR(1,1) waveform characterized by three values (for instance, 0, 1, and 2) and four states (for instance, S0 corresponding to the value 2, S1 corresponding to the value 1, S2 corresponding to the value 1, and S3 corresponding to the value 0) under the D-restriction of the (1,7) runlength-limited (RLL) code.

Based on each of the sampled values Yt supplied from the DEQ 18, the BM calculation unit 21, as described below, calculates branch metric values BM0, BM1, BM3, BM4, BM6, and BM7 using expected values P0, P1, P3, P4, P6, and P7 determined by the PR(1,1):

$$BM0 = (Yt - P0)^2 \tag{1}$$

$$BM1 = (Yt - P1)^2 \tag{2}$$

$$BM3 = (Yt - P3)^2 \tag{3}$$

$$BM4 = (Yt - P4)^2 \tag{4}$$

$$BM6 = (Yt - P6)^2 \tag{5}$$

$$BM7 = (Yt - P7)^2 \tag{6}$$

Naturally, the branch metric values BM2 and BM5 are to be calculated, but are omitted because due to the D-restriction of the (1,7) RLL code, a state of 010 and a state of 101 are not included in a nonreturn to zero (NRZ) signal 1100110011 . . . into which the densest pattern of a return to zero (RZ) signal 10101010 . . . .

As described above, the BM calculation unit 21 calculates the branch metric values depending on differences between each sampled value Yt and the expected values.

The ACS unit 22 adds path metric values of a preceding clock timing stored in the path metric memory 23 to the corresponding branch metric values supplied from the BM calculation unit 21 and compares each given pair of path metric values obtained by the addition. Based on the comparison results, the ACS unit 22 selects the smaller of each given pair of the path metric values and stores the selected path metric values in the path metric memory 23 as new path metric values. As a result of this operation, each path metric value is obtained as an accumulation of the branch metric values.

Specifically, the ACS unit 22 calculates the following path metric values PM(t,0), PM(t,1), PM(t,2), and PM(t,3) when the D-restriction exists as previously described.

$$PM(t,0) = \min\{PM(t-1,0) + BM0, PM(t-1,1) + BM1\} \tag{7}$$

$$PM(t,1) = PM(t-1,3) + BM3 \tag{8}$$

$$PM(t,2) = PM(t-1,0) + BM4 \tag{9}$$

$$PM(t,3) = \min\{PM(t-1,2) + BM6, PM(t-1,3) + BM7\} \tag{10}$$

The above-described expressions (7) and (10) correspond to the selection of the path metric values.

The magnitudes of the elements of the PM(t,0) and PM(t,3) given by the above-described expressions (7) and (10) are expressed by the following four conditions:

$$PM(t-1,0) + BM0 < PM(t-1,1) + BM1 \tag{11}$$

$$PM(t-1,0) + BM0 \geq PM(t-1,1) + BM1 \tag{12}$$

$$PM(t-1,2) + BM6 < PM(t-1,3) + BM7 \tag{13}$$

$$PM(t-1,2) + BM6 \geq PM(t-1,3) + BM7 \tag{14}$$

By the combinations of the above-described conditions, the patterns of state transition for data determination can be classified into four types (1), (2), (3), and (4) as shown in FIG. 2.

In FIG. 2, the pattern (1) corresponds to the above-described conditions (11) and (13) and shows that one of a state transition from S3 to S1, a state transition from S2 to S3, a state transition from S0 to S2, and a state transition from S0 to S0 may occur in a time transition from a time t−1 to a time t. At this point, outputs D0, D1, D2, and D3 of the ACS unit 22 are 0, 1, 0, and 0, respectively.

The pattern (2) corresponds to the above-described conditions (11) and (14) and shows that one of the state transition from S3 to S1, a state transition from S3 to S3, the state transition from S0 to S2, and the state transition from S0 to S0 may occur in the time transition from the time t−1 to the time t. At this point, the outputs D0, D1, D2, and D3 of the ACS unit 22 are 0, 1, 0, and 1, respectively.

The pattern (3) corresponds to the above-described conditions (12) and (13) and shows that one of the state transition from S3 to S1, the state transition from S2 to S3, a state transition from S1 to S0, and the state transition from S0 to S2 may occur in the time transition from the time t−1 to the time t. At this point, the outputs D0, D1, D2, and D3 of the ACS unit 22 are 1, 1, 0, and 0, respectively.

The pattern (4) corresponds to the above-described conditions (12) and (14) and shows that one of the state transition from S3 to S1, the state transition from S3 to S3, the state transition from S1 to S0, and the state transition from S0 to S2 may occur in the time transition from the time t−1 to the time t. At this point, the outputs D0, D1, D2, and D3 of the ACS unit 22 are 1, 1, 0, and 1, respectively.

The outputs D0 through D3 of the ACS unit 22 which outputs vary in accordance with the above-described conditions represent the state transitions that can take place and are called soft decision outputs (soft decision results) of data determined by the state transitions. The values (each 0 or 1) of the soft decision outputs D0 through D3 are successively supplied to the path memory 24, which, in the process of successively shifting the values, successively discards values corresponding to paths that, it is determined based on the continuity of state transition, are not to be selected. The path memory 24 outputs a value (0 or 1) corresponding to a survivor path as detected data.

Figure 3:
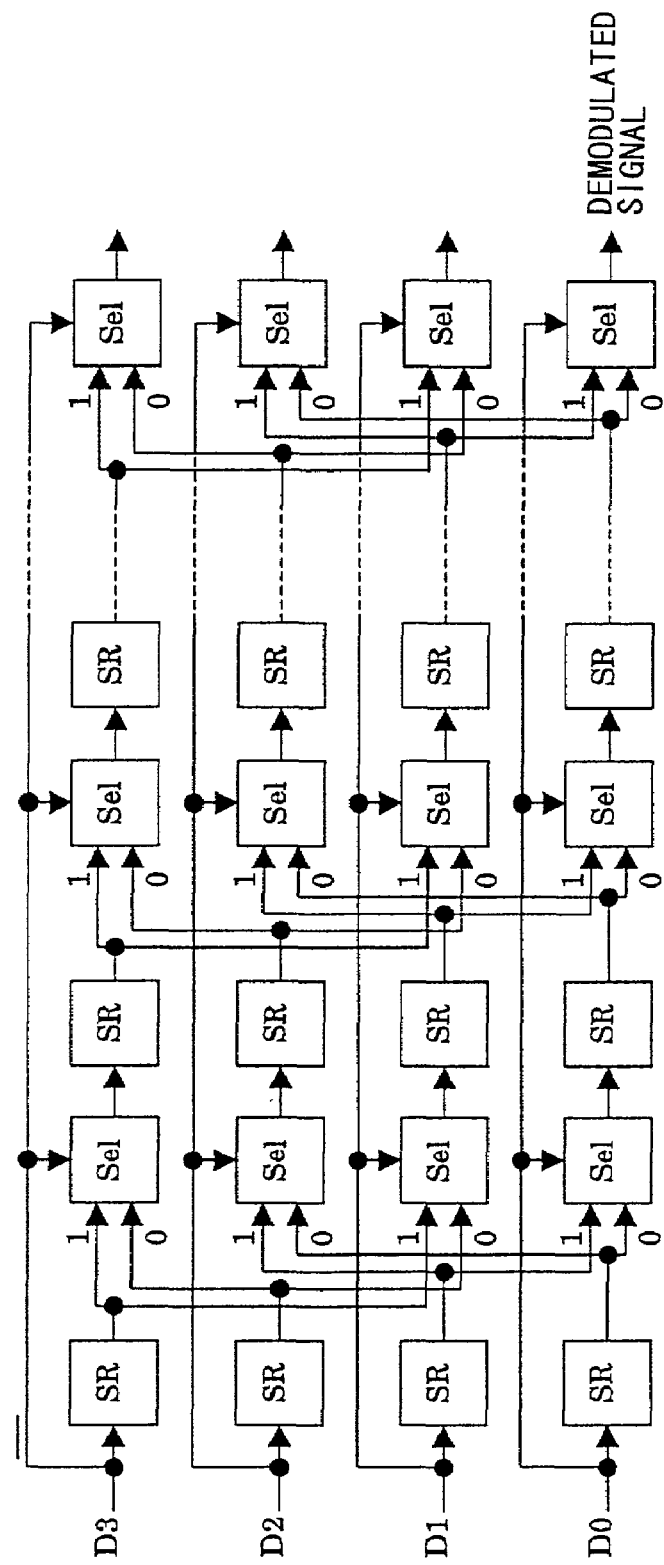
FIG. 3 is a block diagram showing a structure of a path memory of the maximum likelihood detector.

A description will be given, with reference to FIG. 3, of the path memory 24. FIG. 3 is a diagram showing a structure of the path memory 24.

According to FIG. 3, the path memory 24 has registers (SRs) and selectors (Sels) alternately connected for each of the soft decision outputs D0 through D3 supplied from the ACS unit 22. The registers and selectors operate in synchronism with the predetermined clock signal. Each selector selects a value to be set in the corresponding register. For instance, if the soft decision output D3 is 1, it is determined that a path corresponding to the state transition from S3 to S3 has likelihood as shown in the patterns (2) and (4) of FIG. 2 so that values at the time t−1 are set in all the registers for the soft decision output D3 as values at the time t. On the other hand, if the soft decision output D3 is 0, it is determined that a path corresponding to the state transition from S2 to S3 has likelihood as shown in the patterns (1) and (3) of FIG. 2 so that the values of the registers for the soft decision output D2 at the time t−1 are set or copied in all the corresponding registers for the soft decision output D3 as values at the time t.

By repeating the above-described operation, data (0 or 1) corresponding to paths (state transitions) having more likelihood remains in the registers. If any path is determined, that is, if a path merge occurs, at a certain timing, data up to that timing corresponding to the path having the maximum likelihood remains in the registers. At this point, if the path memory 24 has a sufficient memory length, the same data is set in the registers for the respective outputs D0 through D3 at and after a certain stage in the path memory 24. As a result, the final data (value) of one of the outputs D0 through D3 is output from the path memory 24 as reproduced data (demodulated data).

Figure 4:
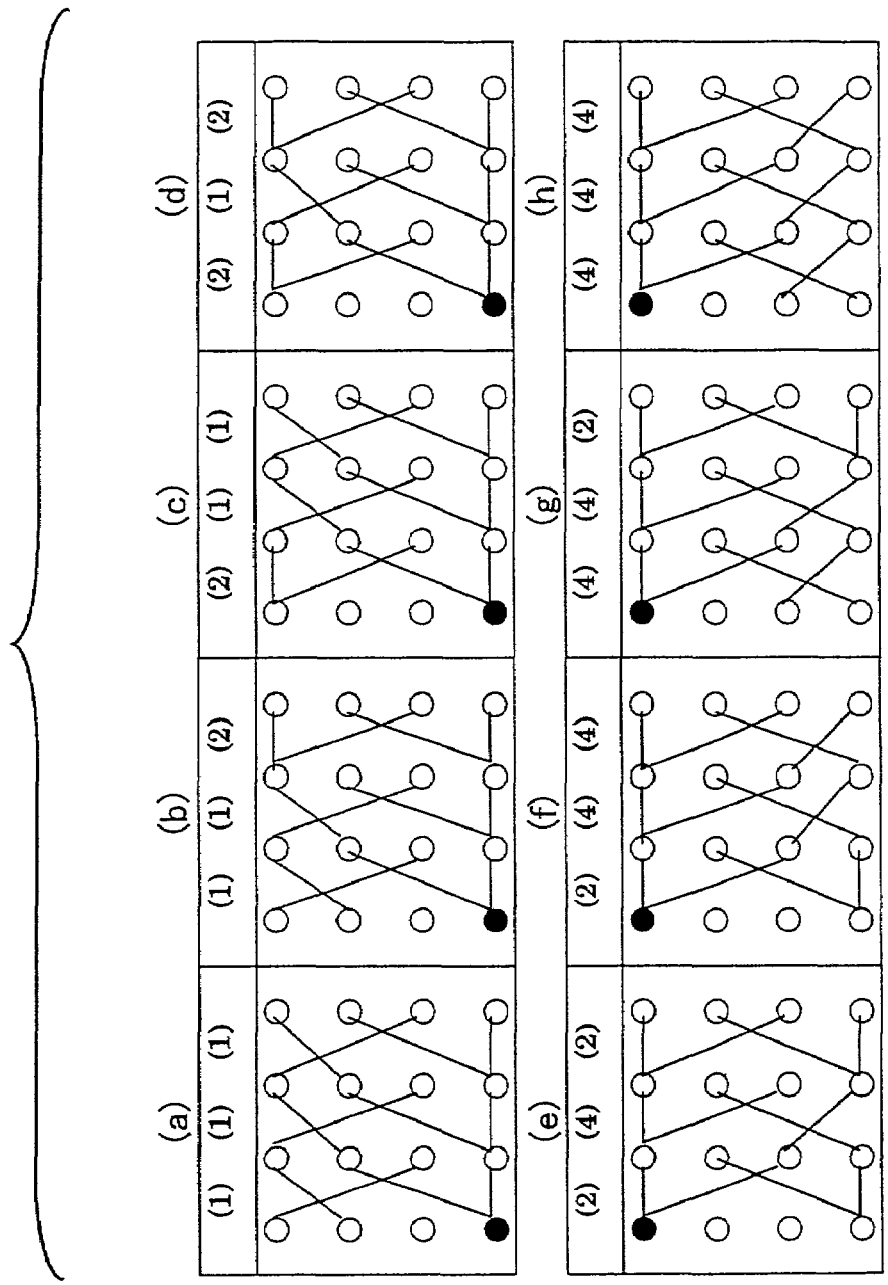
FIG. 4 is a diagram showing combinations of the patterns of state transition in a case where a path merge occurs.

The above-described path merge (path determination) occurs if at least any three of the four state transition patterns of FIG. 2 are connected in series. The combinations of the three patterns include, for instance, eight patterns shown in FIG. 4(*a*) through 4(*h*). In each of FIGS. 4(*a*) through 4(*h*), a black circle indicates the occurrence of the path merge or path determination. That is, when the path determination occurs, a preceding path to the black circle is determined.

Figure 22A:
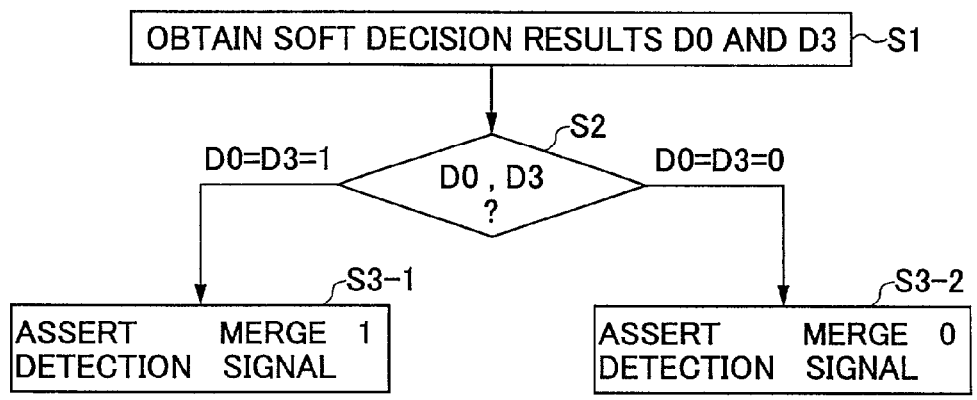
FIGS. 22A and 22B are flowcharts of a defect detection and data reproduction operation of the data reproduction apparatus of FIG. 1.

Next, a description will be given, with reference to FIGS. 5 through 21, of a principal part of the data reproduction apparatus of FIG. 1 which part is engaged in data defect detection and data reproduction based on data defect detection results. A description will also be given, with reference to FIGS. 22A and 22B, of a data defect detection method according to the present invention.

Figure 5:
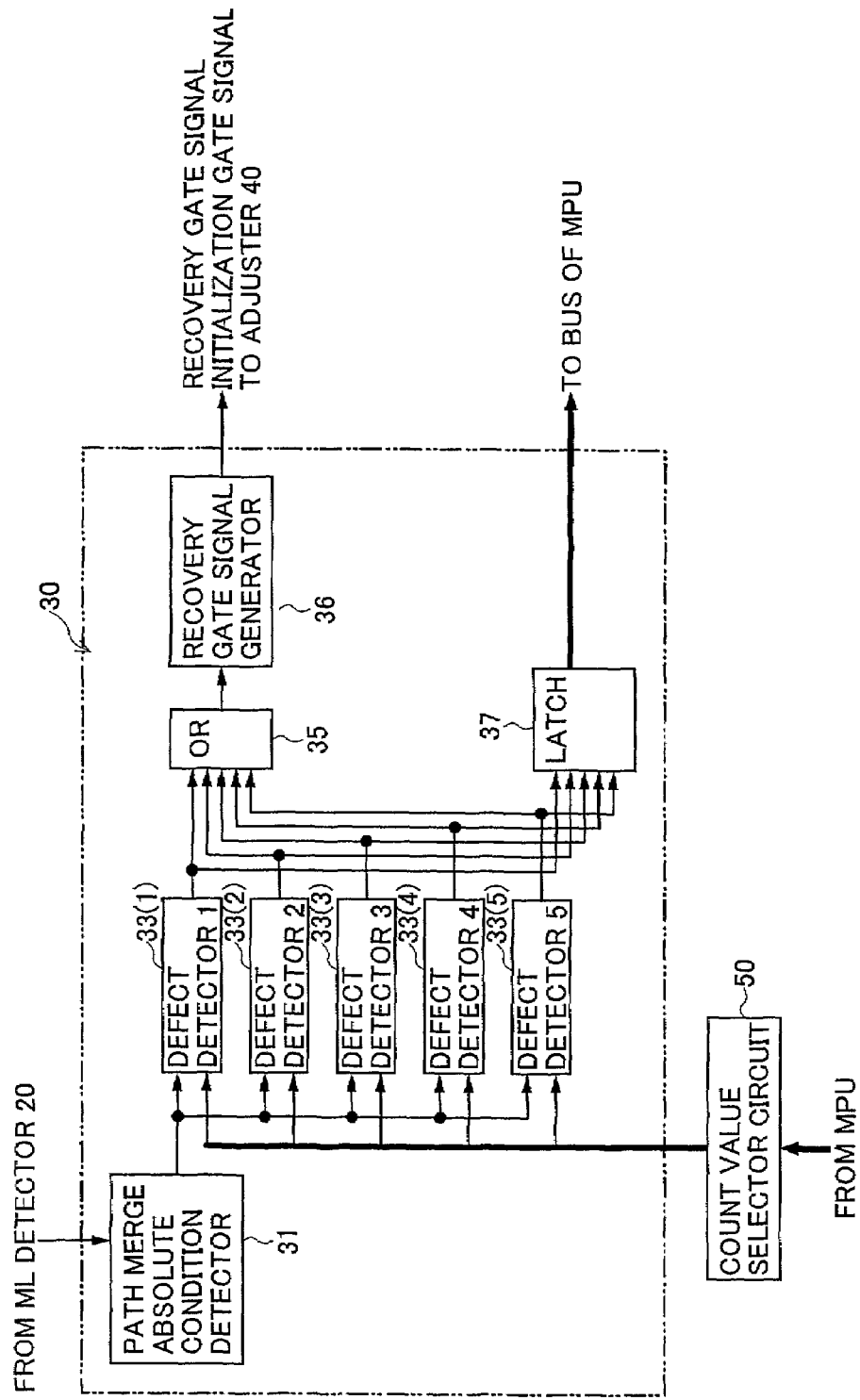
FIG. 5 is a block diagram showing a structure of a defect detection part of the data reproduction apparatus of FIG. 1.

First, a description will be given of the defect detection part 30 of FIG. 1. FIG. 5 is a diagram showing a structure of the defect detection part 30.

According to FIG. 5, the defect detection part 30 includes a path merge absolute condition detector 31 (a waveform state detection part), five defect detectors 33(1) through 33(5) (a defect determination part), an OR circuit 35, a recovery gate signal generator 36, and a latch circuit 37. The path merge absolute condition detector 31, based on the soft decision outputs D0 and D3 obtained from the ACS unit 22 of the ML detector 20 (step S1 of FIG. 22A), detects conditions under which the path merge that is a state where a data path is determined in a ML decoding operation occurs without fail, and outputs a detection signal. Suppose that a state where data "1" is determined by the path merge is referred to as a merge 1 and a state where data "0" is determined by the path merge is referred to as a merge 0. Then, the merge 1 state corresponds to a peak value of the sampled values Yt and the merge 0 state corresponds to a bottom value of the sampled values Yt. Therefore, the state of the waveform of the reproduced signal can be estimated from the combinations of the merges 1 and 0.

On the other hand, the state transition of data is not determined if the sampled value Yt is obtained from an edge part of the reproduced signal while the state transition of data is determinable if the sampled value Yt is the peak or bottom value. That is, a state of D3=1 and D0=1 corresponds to the pattern (4) of FIG. 2 and a state transition path from S3 to S3 is selected as a path having likelihood in that state. Therefore, the merge 1 state is entered when D3=1 and D0=1. Further, a state of D3=0 and D0=0 corresponds to the pattern (1) of FIG. 2 and a state transition path from S0 to S0 is selected as a path having likelihood in that state. Therefore, the merge 2 state is entered when D3=0 and D0=0.

Thus, by checking the soft decision outputs D3 and D0 supplied from the ACS unit 22 (step S2 of FIG. 22A), the path merge absolute condition detector 31 detects the merge 1 where the data "1" is determined and the merge 0 where the data "0" is determined. The path merge absolute condition detector 31 has a structure as shown in FIG. 6.

Figure 6:
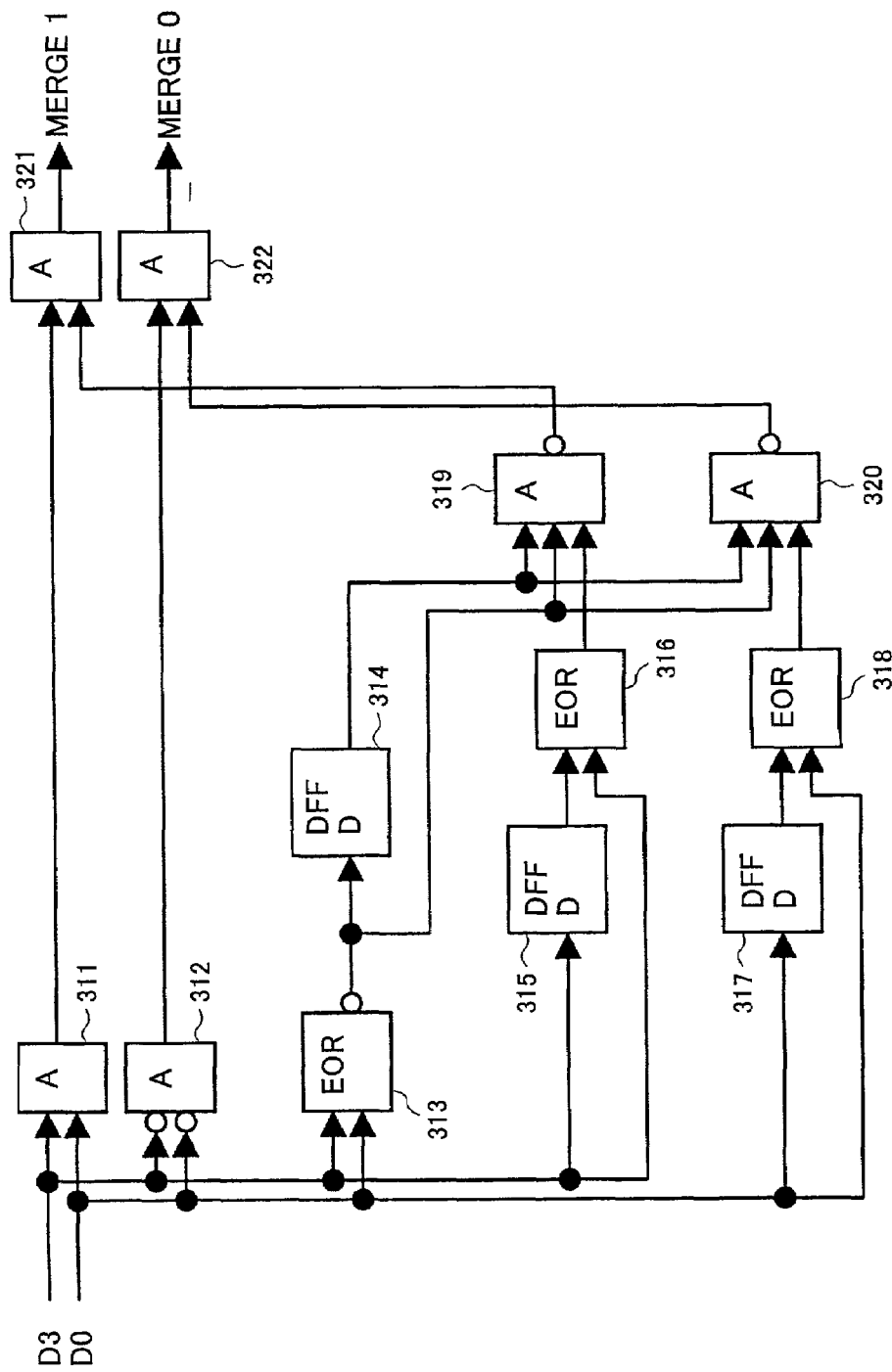
FIG. 6 is a block diagram showing a structure of a path merge absolute condition detector of the defect detection part of FIG. 5.

According to FIG. 6, the path merge absolute condition detector 31 includes four AND circuits 311, 312, 321, and 322. The soft decision outputs D3 and D0 are input to the AND circuit 311. The output of the AND circuit 311 is valid (for instance, high) if D3=1 and D0=1. The output of the AND circuit 311 is input to the AND circuit 321 that is gate-controlled by a later-described first mask signal. The output of the AND circuit 321 is a merge 1 detection signal (first information) representing the above-described merge 1 state.

The AND circuit 312 is supplied with the inversion signals of the soft decision outputs D3 and D0, and the output of the AND circuit 312 is valid (for instance, high) if D3=0 and D1=0. The output of the AND circuit is input to the AND circuit 322 that is gate-controlled by a later-described second mask signal. The output of the AND circuit 322 is a merge 0 detection signal (second information) representing the above-described merge 0 state.

The soft decision outputs D3 and D0 are input to an exclusive OR (EOR) circuit 313 and an inverted output thereof is input to a latch circuit 314. The inverted output of the EOR circuit 313 is valid (for instance, high) if D3=D0. Therefore, if both of the inverted output of the EOR circuit 313 and the latch circuit 314 are valid, this represents a state where D3=D0 for a period of two clock pulses (timings).

The soft decision output D3 is input to a latch circuit 315. A signal latched in the latch circuit 315 (the output signal of the latch circuit 315) and the soft decision output D3 are input to an EOR circuit 316. The EOR circuit 316 outputs a signal that is valid (for instance, high) if the soft decision output D3 has different values at two successive clock timings, that is, at a change point (an edge) of the soft decision output D3. The output signals of the EOR circuit 316, EOR circuit 313, and the latch circuit 314 are input to an AND circuit 319. As a result, the AND circuit 319 outputs the first mask signal that is valid (low) if the soft decision output D3 changes from 0 to 1 and the soft decision output D0 changes from 0 to 1.

The soft decision output D0 is input to a latch circuit 317. A signal latched in the latch circuit 317 (the output signal of the latch circuit 317) and the soft decision output D0 are input to an EOR circuit 318. The EOR circuit 317 outputs a signal that is valid (for instance, high) if the soft decision output D0 has different values at two successive clock timings, that is, at a change point (an edge) of the soft decision output D0. The output signals of the EOR circuit 317, the EOR circuit 313, and the latch circuit 314 are input to an AND circuit 320. As a result, the AND circuit 320 outputs the second mask signal that is valid (low) if the soft decision output D0 changes from 0 to 1 and the soft decision output D3 changes from 0 to 1.

Figure 7:
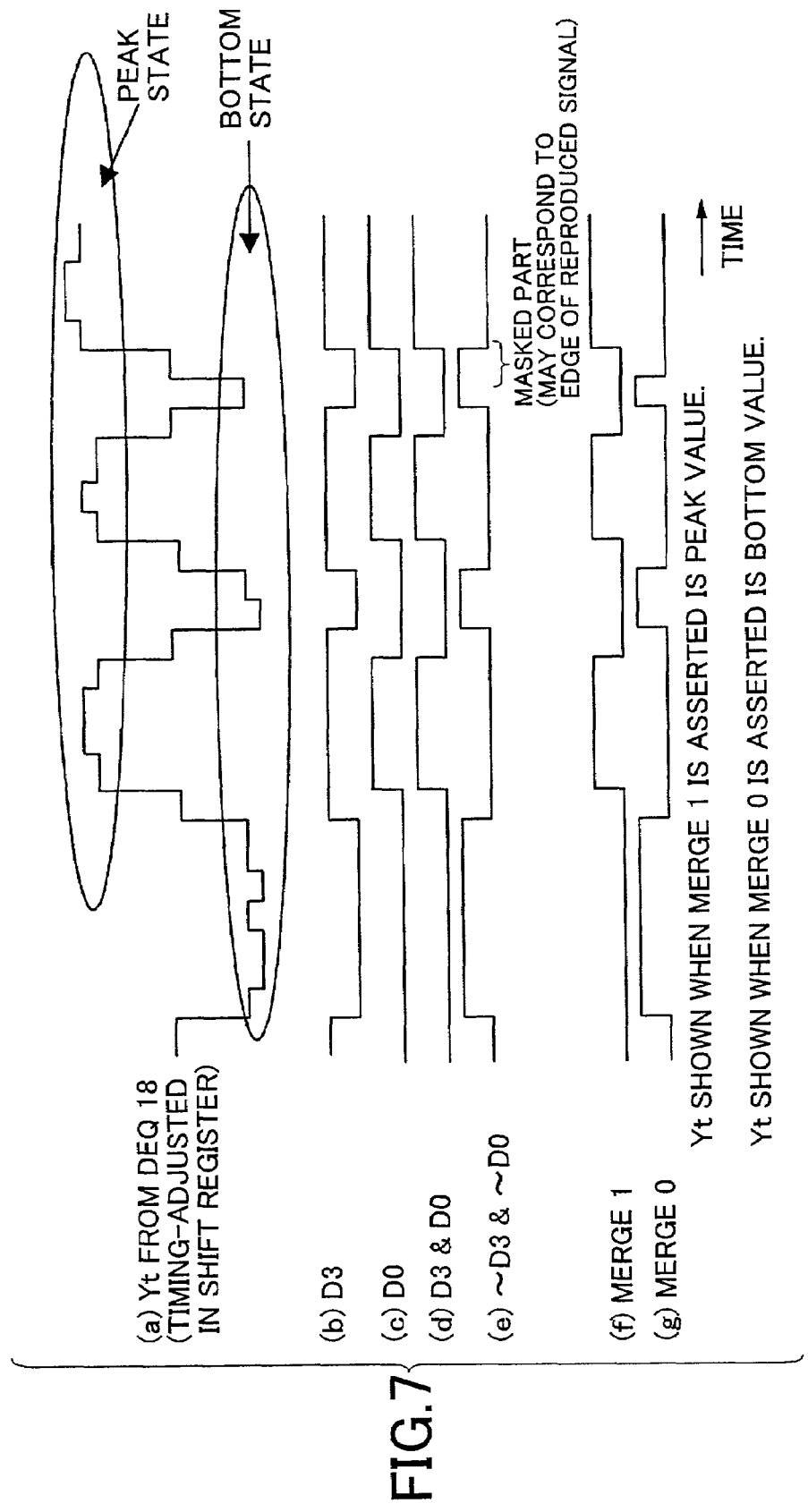
FIG. 7 is a timing chart of signals for illustrating an operation of the path merge absolute condition detector of FIG. 6.

FIG. 7 is a timing chart of signals for illustrating an operation of the path merge absolute condition detector 31.

According to the path merge absolute condition detector 31 of the above-described configuration, if the sampled value Yt (referring to a group of the individual sampled values Yt in this case) supplied from the DEQ 18 varies as shown in FIG. 7(a), for instance, the merge 1 detection signal and the merge 0 detection signal are generated as shown in FIGS. 7(f) and 7(g) based on the soft decision outputs D3 and D0 (shown in FIGS. 7(b) and 7(c), respectively) supplied from the ACS unit 22 of the ML detector 20, the AND output of the soft decision outputs D3 and D0 (the output of the AND circuit 311) D3&D0 shown in FIG. 7(d), and the AND output of the inversion signals of the soft decision outputs D3 and D0 (the output of the AND circuit 312) ~D3&~D0 shown in FIG. 7(e). The merge 1 detection signal is valid (asserted) when the sampled value Yt is in a peak state and the merge 0 detection signal is valid (asserted) when the sampled value Yt is in a bottom state (steps S3-1 and S3-2 of FIG. 22A).

If the soft decision outputs D3 and D0 change from 0 to 1 at the same timing, this may occur at an edge of the reproduced signal. In such a case, the first and second mask signals from the AND circuits 319 and 320 are made valid to mask the merge 1 detection signal and the merge 0 detection signal, respectively, so that the merge 1 detection signal or the merge 0 detection signal is not made valid. In the case shown in FIG. 7, the merge 0 detection signal is masked as shown in FIG. 7(g).

Practically, relationship between the sampled value Yt and the signals (D3, D0, D3&D0, ~D3&~D0, the merge 1 detection signal, and the merge 0 detection signal) are different from those shown in FIG. 7 due to processing delay. The sampled value Yt shown in FIG. 7 is delayed in a shift register by an amount corresponding to the processing delay.

Back in FIG. 5, each of the defect detectors 33(1) through 33(5) is supplied with the merge 1 detection signal and the merge 0 detection signal from the path merge absolute condition detector 31 and a count value for time measurement from an MPU (not shown in the drawing) via a count value selector circuit 50. Each of the defect detectors 33(1) through 33(5) outputs a defect detection signal based on the time measurement results of the state of each of the merge 1 detection signal and the merge 0 detection signal. The defect detection signal output from each of the defect detectors 33(1) through 33(5) is supplied to the recovery gate signal generator 36 via the OR circuit 35.

When the defect detection signal is input to the recovery gate signal generator 36 from one of the defect detectors 33(1) through 33(5), the recovery gate signal generator 36, as will be later described, generates a recovery gate signal and an initialization gate signal and supplies the signals to the adjuster 40 shown in FIG. 1. Based on the recovery gate signal and the initialization gate signal, the adjuster 40 controls the output of the expected values to be fed back to the ML detector 20 or the variation amount for the expected values.

The defect detection signal supplied from any of the defect detectors 33(1) through 33(5) is latched in the latch circuit 37 and is supplied to the bus of the MPU. The MPU can recognize what type of defect is included in the recorded data based on the state of the defect detection signal.

The defect detectors 33(1) through 33(5) are configured as follows.

Figure 8:
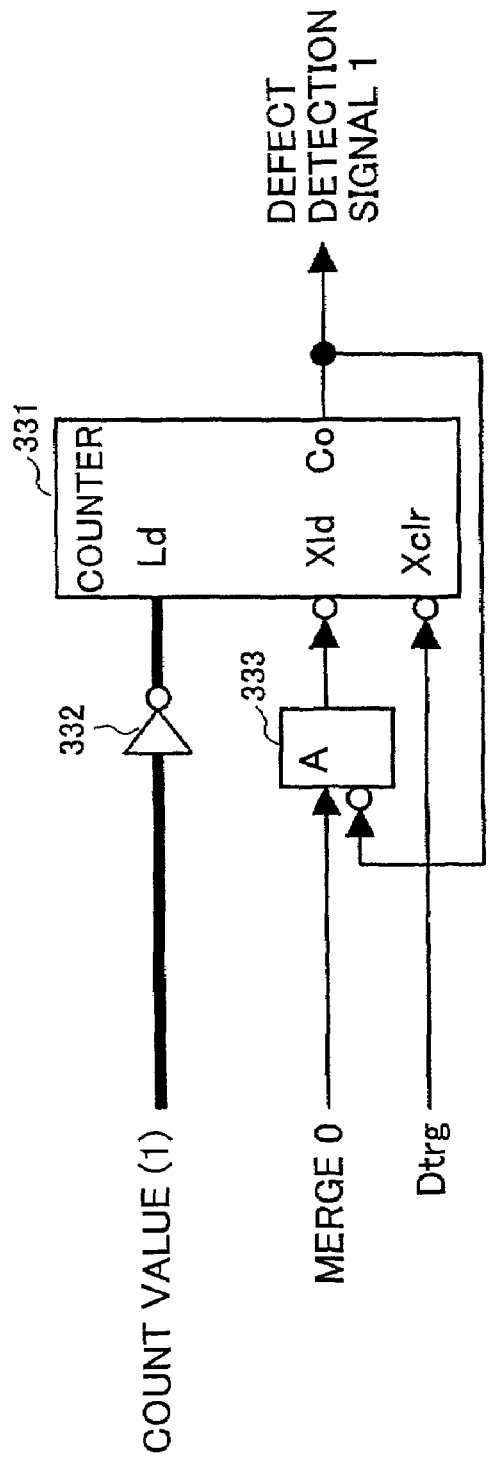
FIG. 8 is a diagram showing a structure of a defect detector of the defect detection part of FIG. 5.

First, FIG. 8 is a diagram showing a structure of the defect detector 33(1). According to FIG. 8, the defect detector 33(1) includes a counter 331 (a state continuation period measurement part), a bit inverter circuit 332, and an AND circuit 333. A count value (1) supplied via the count value selector circuit 50 from the MPU is input via the bit inverter circuit 332 to a load value terminal (Ld) of the counter 331. That is the complement value of the count value (1) is supplied to the counter 331 as the load value (Ld value).

A Dtrg signal that rises at a start timing of a given data part of each sector of the magneto-optical disk 10 is input to a clear terminal (Xclr) of the counter 331, which outputs a low-level signal if the Dtrg signal is high (valid). When the counter 331 counts up to a given maximum value that is the sum of the count value (1) and its complement value, the counter 331 outputs a high-level signal from its output terminal (Co).

The AND circuit 333 is supplied with the merge 0 detection signal corresponding to the bottom state of the sampled value Yt and representing the conditions for determining the data "0" and the inverted output signal of the counter 331. The output signal of the AND circuit 333 is supplied to a load control terminal (Xld) of the counter 331. When the output signal of the AND circuit 333 rises up to a high level, the complement value of the count value (1) is loaded into the counter 331 so that the counter 331 performs a count operation. The clock signal for the count operation input to the counter 331 is omitted in FIG. 8 (also omitted in FIGS. 9 through 12 and 20).

In the defect detector 33(1) having the above-described structure, when the merge 0 detection signal becomes high (valid) after the Dtrg signal becomes high, the output signal of the AND circuit 333 becomes high so that the complement value of the count value (1) is loaded into the counter 331. When the count operation from the complement value to the given maximum value (that is, the count operation for the count value (1)) is terminated, the counter 331 outputs the high-level signal from its output terminal (Co).

When the output signal of the AND circuit 333 becomes low due to the high-level signal output from the output terminal (Co), the counter 331 terminates the count operation and immediately thereafter, outputs the low-level signal from the output terminal (Co). Then, again, the complement value of the count value (1) is loaded into the counter 331 and the count operation is resumed.

Thereafter, in a state where the merge 0 detection signal is maintained at a high level, or is kept valid, the above-described operation is repeated. As a result, every time the counter 331 terminates the count operation from the loaded complement value to the given maximum value, that is, every time the counter 331 terminates the count operation for the count value (1), the counter 331 outputs a pulse signal from the output terminal (Co).

On the other hand, if the merge 0 detection signal becomes low during the count operation of the counter 331, the output signal of the AND circuit 333 becomes low so that the counter 331 terminates the count operation.

Figure 13:
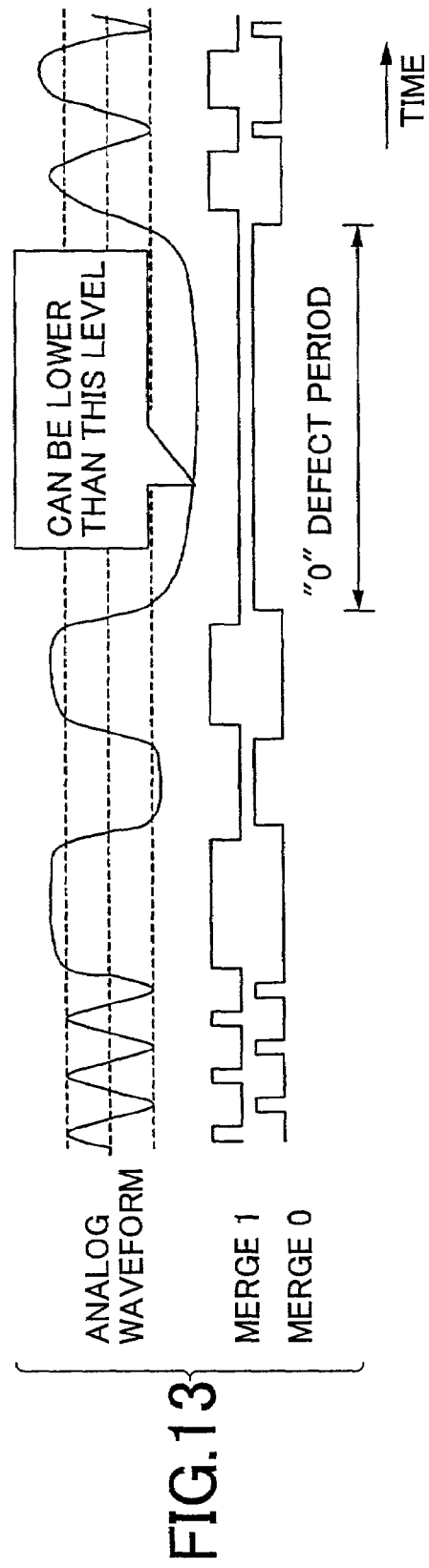
FIG. 13 is a timing chart of signals for illustrating a defect of recorded data (an abnormality in a reproduced signal) detected by the defect detector of FIG. 8.
Figure 22B:
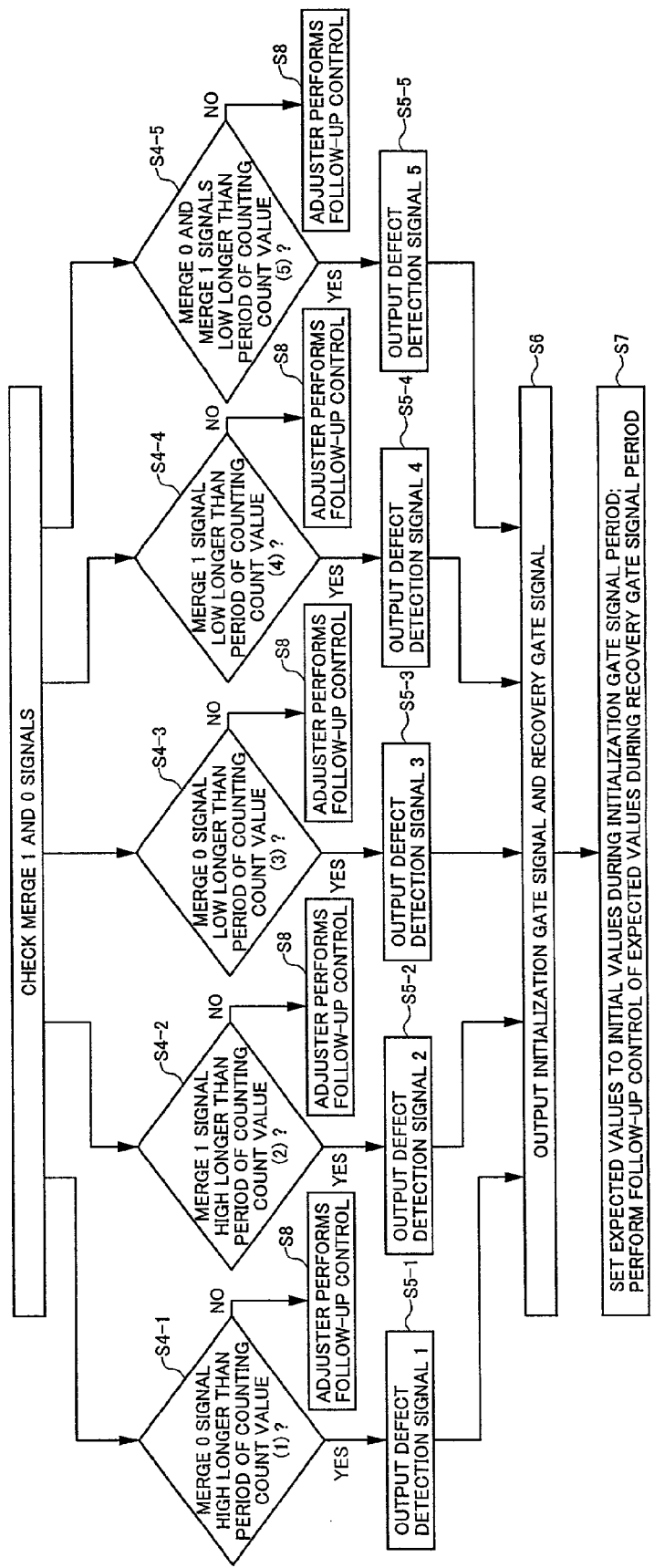

Therefore, if the merge 0 detection signal is maintained at the high level longer than a period of counting the count value (1) (step S4-1 of FIG. 22B), the defect detector 33(1) outputs a defect detection pulse signal 1 (step S5-1 of FIG. 22B). That the merge 0 detection signal is maintained at the high level for a long period of time means that the reproduced signal is maintained at a low level for a long period of time as shown in FIG. 13. Therefore, the count value (1) may be determined based on a maximum period of time for which the reproduced signal can be maintained at the low level normally. In the case of the (1,7) RLL code, for instance, since data is not "0" for over six consecutive clock cycles, the count value (1) may be determined based on the six clock cycles. Further, the count value (1) may be determined based on the length of a series of data "0" (a "0" defect period) empirically obtained as a defect of recorded data.

In other words, the defect detector 33(1) detects a defect of recorded data that appears as a prolonged low-level period of the reproduced signal.

Figure 9:
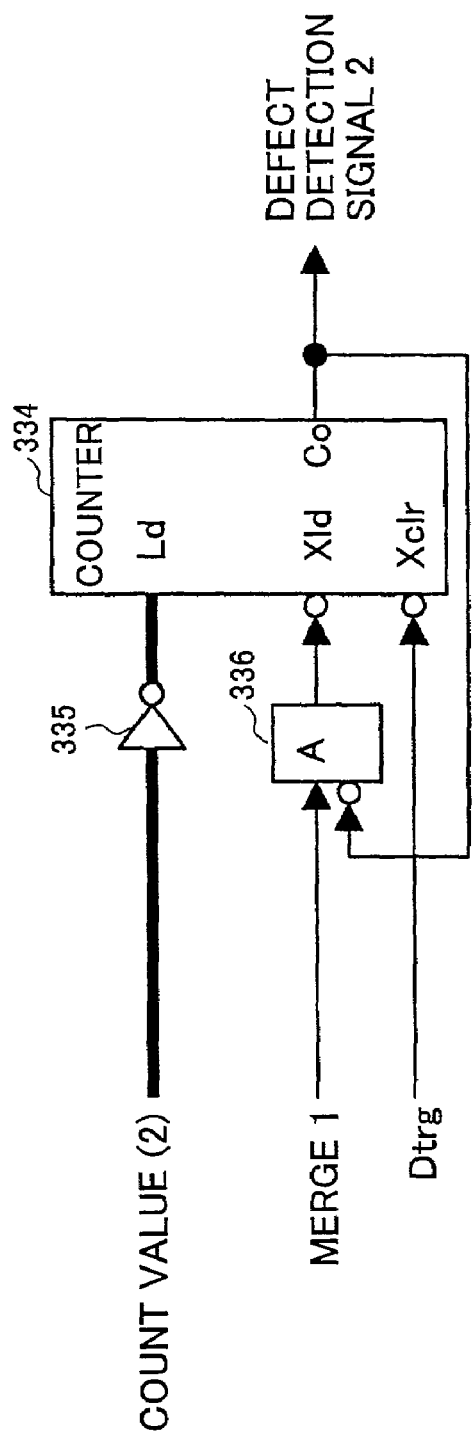
FIG. 9 is a diagram showing a structure of another defect detector of the defect detection part of FIG. 5.

Next, FIG. 9 is a diagram showing a structure of the defect detector 33(2).

According to FIG. 9, the defect detector 33(2) includes a counter 334 (a state continuation period measurement part), a bit inverter circuit 335, and an AND circuit 336. The counter 334 has the same function as the counter 331 shown in FIG. 8 and includes a load value terminal (Ld), a clear terminal (Xclr), a load control terminal (Xld), and an output terminal (Co).

A count value (2), which is supplied from the MPU via the count value selector circuit 50, is input to the load value terminal (Ld) via the bit inverter circuit 335. That is, the complement value of the count value (2) is input to the load value terminal (Ld) of the counter 334. The AND circuit 336 has the same function and structure as the AND circuit 333 shown in FIG. 8 except that the merge 1 detection signal corresponding to the peak state of the sampled value Yt and representing the conditions for determining the data "1" replaces the merge 0 detection signal.

Figure 14:
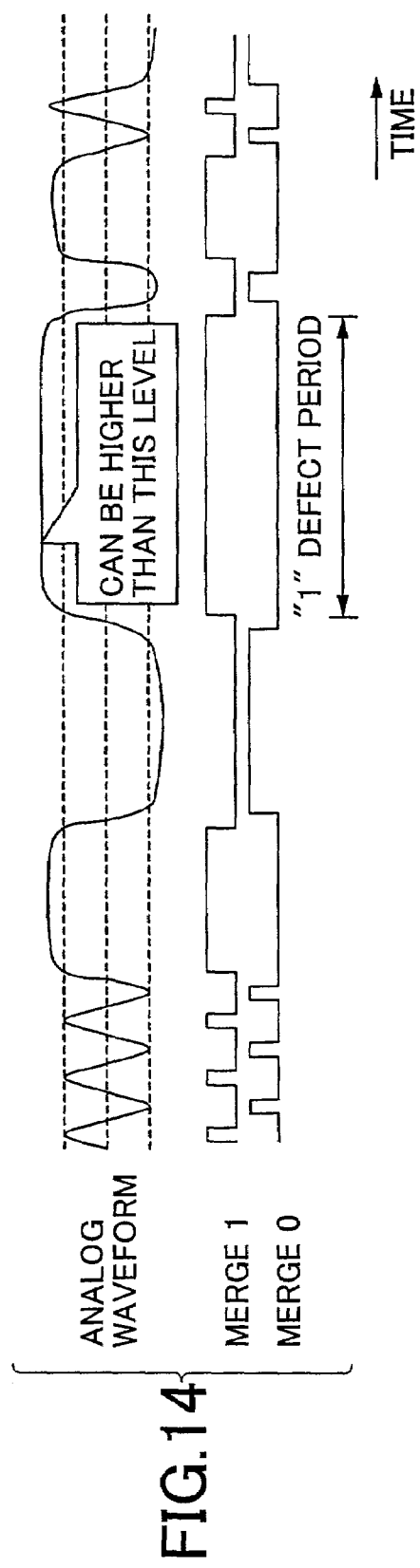
FIG. 14 is a timing chart of signals for illustrating a defect of recorded data (an abnormality in a reproduced signal) detected by the defect detector of FIG. 9.

According to the above-described structure, the defect detector 33(2) outputs a defect detection pulse signal 2 if the merge 1 detection signal is maintained at a high level longer than a period of counting the count value (2) (steps S4-2 and S5-2 of FIG. 22B). That the merge 1 detection signal is maintained at the high level for a long period of time means that the reproduced signal is maintained at a high level for a long period of time as shown in FIG. 14. Therefore, the count value (2) may be determined based on a maximum period of time for which the reproduced signal can be maintained at the high level normally. In the case of the (1,7) RLL code, for instance, since data is not "1" for over six consecutive clock cycles, the count value (2) may be determined based on the six clock cycles. Further, the count value (2) may be determined based on the length of a series of data "1" (a "1" defect period) empirically obtained as a defect of recorded data.

In other words, the defect detector 33(2) detects a defect of recorded data that appears as a prolonged high-level period of the reproduced signal.

Figure 10:
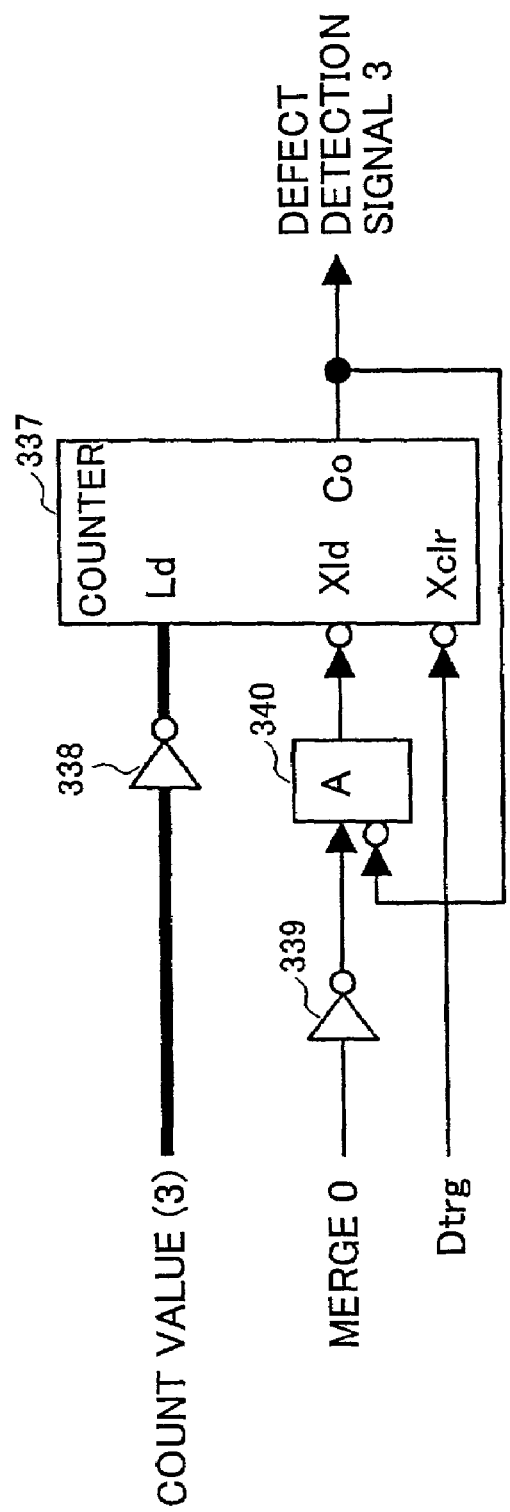
FIG. 10 is a diagram showing a structure of another defect detector of the defect detection part of FIG. 5.

Next, FIG. 10 is a diagram showing a structure of the defect detector 33(3).

According to FIG. 10, the defect detector 33(3) includes a counter 337 (a state continuation period measurement part), a bit inverter circuit 338, an inverter circuit 339, and an AND circuit 340. The counter 337 has the same function as the counters 331 and 334 shown in FIGS. 8 and 9, respectively, and includes a load value terminal (Ld), a clear terminal (Xclr), a load control terminal (Xld), and an output terminal (Co).

A count value (3), which is supplied from the MPU via the count value selector circuit 50, is input to the load value terminal (Ld) via the bit inverter circuit 338. That is, the complement value terminal (Ld) of the counter 337. The AND circuit 340 has the same function and structure as the AND circuits 333 and 336 shown in FIGS. 8 and 9 except that the merge 0 detection signal is input to the AND circuit 340 via the inverter circuit 339.

Figure 15:
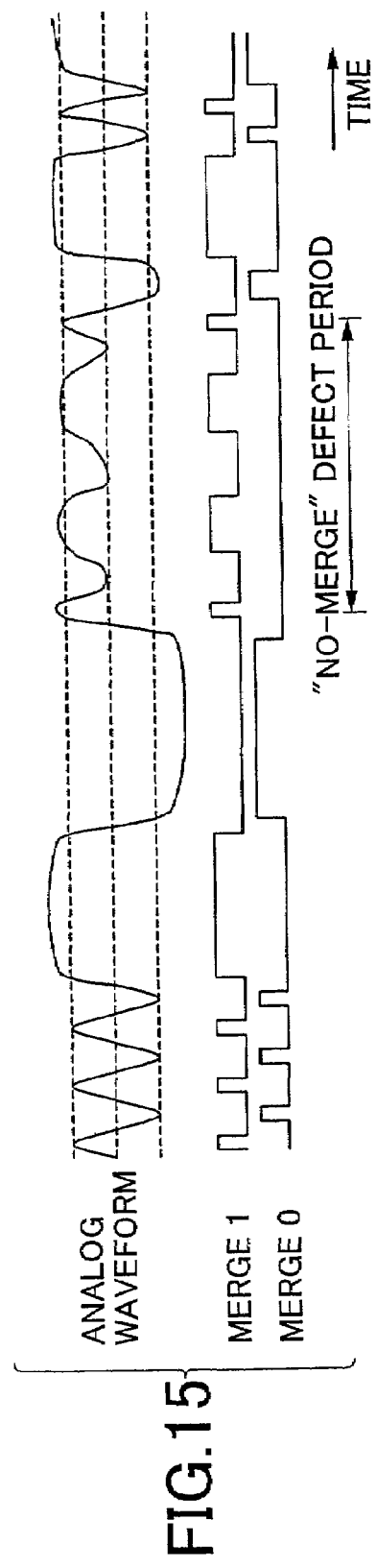
FIG. 15 is a timing chart of signals for illustrating a defect of recorded data (an abnormality in a reproduced signal) detected by the defect detector of FIG. 10.

According to the above-described structure, the defect detector 33(3) outputs a defect detection pulse signal 3 if the merge 0 detection signal is maintained at a low level for a longer period of time than a period of counting the count value (3) (steps S4-3 and S5-3 of FIG. 22B). As shown in FIG. 7, the merge 0 signal is low when the merge 1 detection signal is high and the reproduced signal rises or falls (that is, at edge parts of the reproduced signal). Therefore, that the merge 0 detection signal is maintained at the low level for a long period of time means that the reproduced signal fluctuates in a relatively high level range for a long period of time as shown in FIG. 15. Therefore, the count value (3) may be determined based on a maximum period of time for which the reproduced signal can normally fluctuate continuously in the relatively high level range. Further, the count value (3) may be determined based on a period of continuation of a state where data is determinable as neither "1" nor "0" (a "no-merge" defect period), which period is empirically obtained as a defect of recorded data.

In other words, the defect detector 33(3) detects a defect of recorded data that appears as fluctuation of the reproduced signal between peak and center levels thereof.

Figure 11:
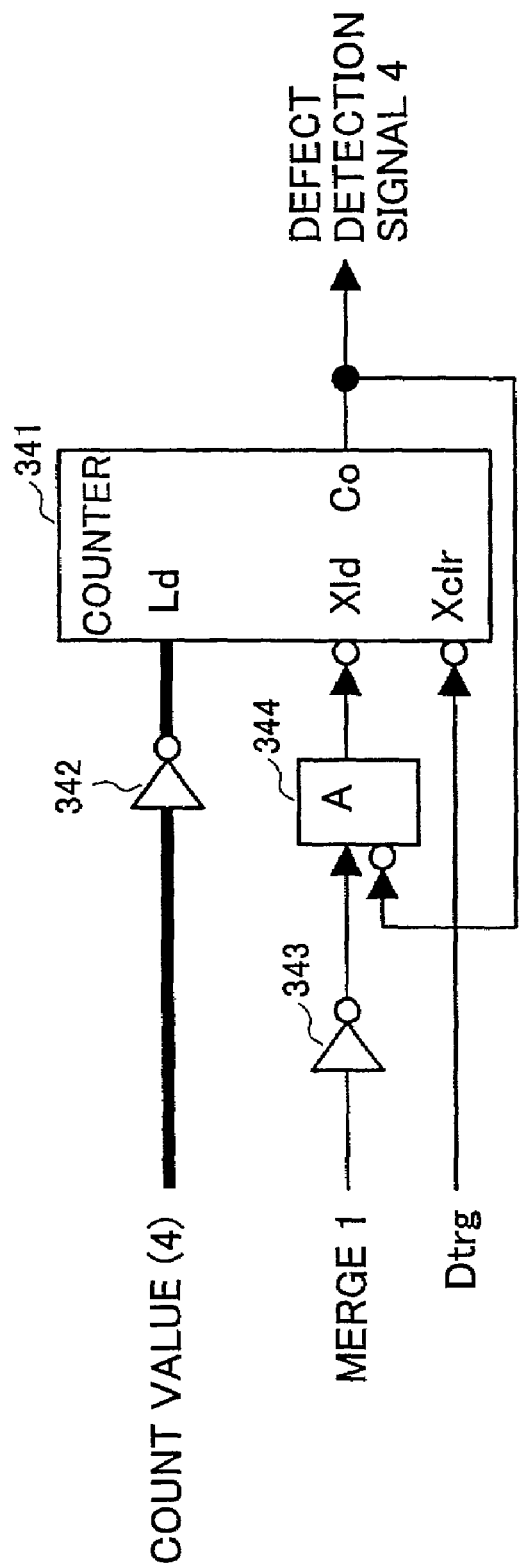
FIG. 11 is a diagram showing a structure of another defect detector of the defect detection part of FIG. 5.

Next, FIG. 11 is a diagram showing a structure of the defect detector 33(4).

According to FIG. 11, the defect detector 33(4) includes a counter 341 (a state continuation period measurement part), a bit inverter circuit 342, an inverter circuit 343, and an AND circuit 344. The counter 341 has the same function as the counters 331, 334, and 337 shown in FIGS. 8, 9, and 10, respectively, and includes a load value terminal (Ld), a clear terminal (Xclr), a load control terminal (Xld), and an output terminal (Co).

A count value (4), which is supplied from the MPU via the count value selector circuit 50, is input to the load value terminal (Ld) via the bit inverter circuit 342. That is, the complement value of the count value (4) is input to the load value terminal (Ld) of the counter 341. The inverter circuit 343 has the same function and structure as the inverter circuit 339 shown in FIG. 10 except that the merge 1 detection signal replaces the merge 0 detection signal. The AND circuit 344 has the same function and structure as the AND circuits 333 and 336 shown in FIGS. 8 and 9 except that the output signal of the inverter circuit 343 is input to the AND circuit 344.

Figure 16:
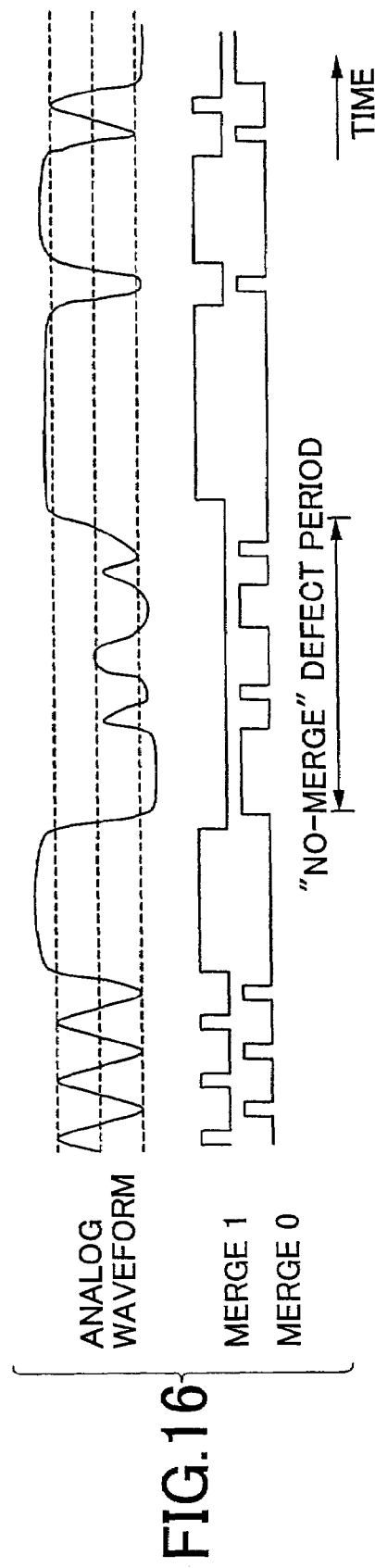
FIG. 16 is a timing chart of signals for illustrating a defect of recorded data (an abnormality in a reproduced signal) detected by the defect detector of FIG. 11.
Figure 17:
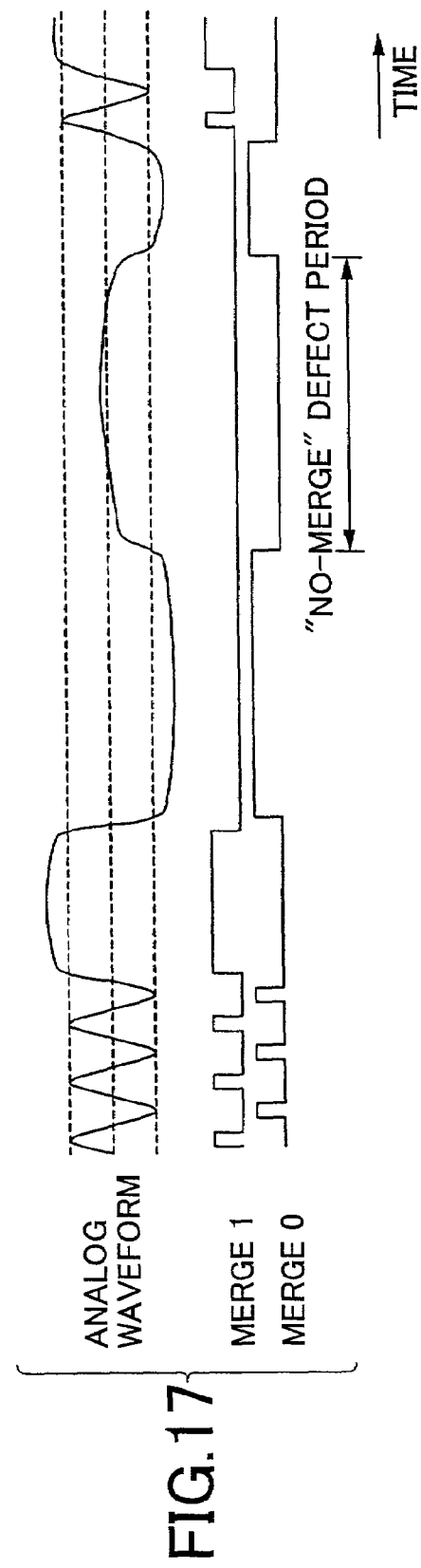
FIG. 17 is a timing chart of signals for illustrating a defect of recorded data (an abnormality in a reproduced signal) detected by the defect detector of FIG. 12.

According to the above-described structure, the defect detector 33(4) outputs a defect detection pulse signal 4 if the merge 1 detection signal is maintained at a low level for a longer period of time than a period of counting the count value (4) (steps S4-4 and S5-4 of FIG. 22B). As shown in FIG. 7, the merge 1 signal is low when the merge 0 detection signal is high and the reproduced signal rises or falls (that is, at the edge parts of the reproduced signal). Therefore, that the merge 1 detection signal is maintained at the low level for a long period of time means that the reproduced signal fluctuates in a relatively low level range for a long period of time as shown in FIG. 16. Therefore, the count value (4) may be determined based on a maximum period of time for which the reproduced signal can normally fluctuate continuously in the relatively low level range. Further, the count value (4) may be determined based on the period of continuation of the state where data is determinable as neither "1" nor "0" (the "no-merge" defect period), which period is empirically obtained as a defect of recorded data.

In other words, the defect detector 33(4) detects a defect of recorded data that appears as fluctuation of the reproduced signal between a bottom level and the center level thereof.

Figure 12:
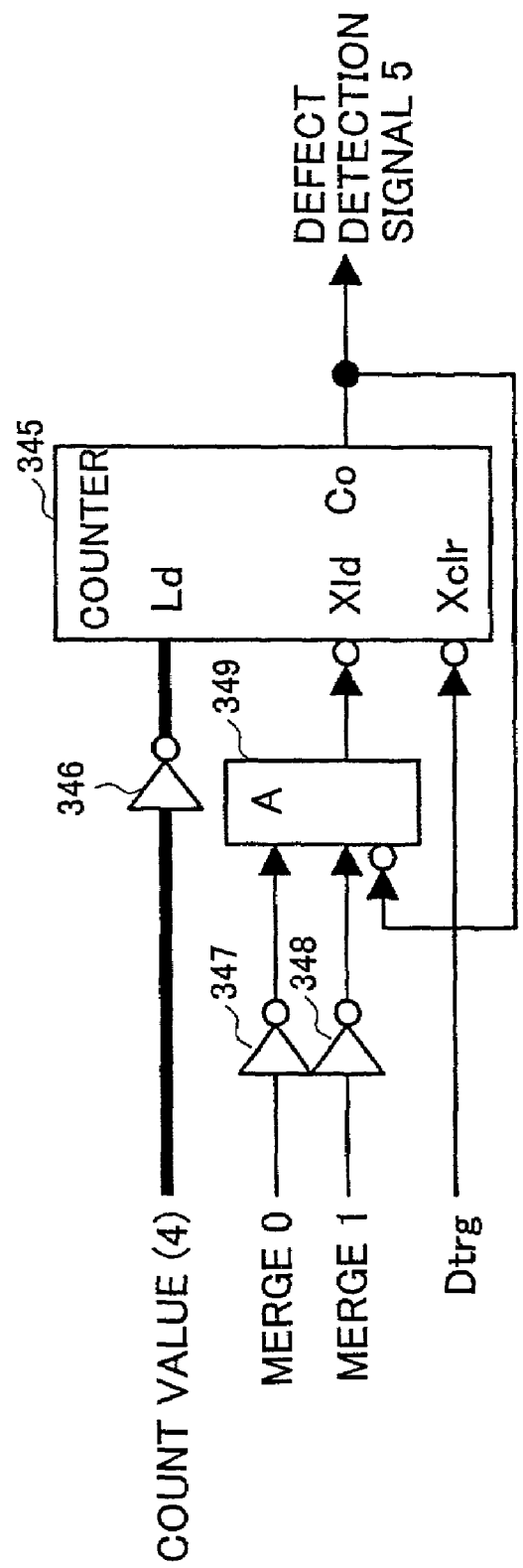
FIG. 12 is a diagram showing a structure of another defect detector of the defect detection part of FIG. 5.

Next, FIG. 12 is a diagram showing a structure of the defect detector 33(5).

According to FIG. 12, the defect detector 33(5) includes a counter 345 (a state continuation period measurement part), a bit inverter circuit 346, inverter circuits 347 and 348, and an AND circuit 349. The counter 345 has the same function as the counters 331, 334, 337, and 341 shown in FIGS. 8, 9, 10, and 11, respectively, and includes a load value terminal (Ld), a clear terminal (Xclr), a load control terminal (Xld), and an output terminal (Co).

A count value (5), which is supplied from the MPU via the count value selector circuit 50, is input to the load value terminal (Ld) via the bit inverter circuit 346. That is, the complement value of the count value (5) is input to the load value terminal (Ld) of the counter 345. The merge 0 detection signal is input via the inverter circuit 347 to the AND circuit 349 and the merge 1 detection signal is input via the inverter circuit 348 to the AND circuit 349. Like the AND circuits 333, 336, 340, and 344 shown in FIGS. 8, 9, 10, and 11, respectively, the AND circuit 349 is also supplied with the inverted output signal of the counter 345. The output signal of the AND circuit 349 is input to the load control terminal (Xld) of the counter 345.

According to the above-described structure, the defect detector 33(5) outputs a defect detection pulse signal 5 if each of the merge 0 detection signal and the merge 1 detection signal is maintained at the low level for a longer period of time than a period of counting the count value (5) (steps S4-5 and S5-5 of FIG. 22B). As shown in FIG. 7, the merge 0 detection signal and the merge 1 detection signal become low at the same time at the edge parts of the reproduced signal. Therefore, that the merge 0 detection signal and the merge 1 detection signal are maintained at the low levels for a long period of time means that the reproduced signal is maintained around the center level corresponding to the edge parts of the reproduced signal for a long period of time. Accordingly, the count value (5) may be determined based on a maximum period of time for which the reproduced signal can normally be maintained around the center level. Further, the count value (5) may be determined based on the period of continuation of the state where data is determinable as neither "1" nor "0" (the "no-merge" defect period), which period is empirically obtained as a defect of recorded data.

In other words, the defect detector 33(5) detects a defect of recorded data that appears as fluctuation of the reproduced signal around the center level thereof.

In the above-described cases, if the determination result in each of steps S4-1 through S4-5 is "NO", that is, if no defect of the recorded data is detected, the adjuster 40 performs follow-up control of the expected values or the offset amount therefor (step S8 of FIG. 22B).

Here, a description will be given, with reference to FIG. 18, of a basic data format recorded on the magneto-optical disk 10.

Figure 18:
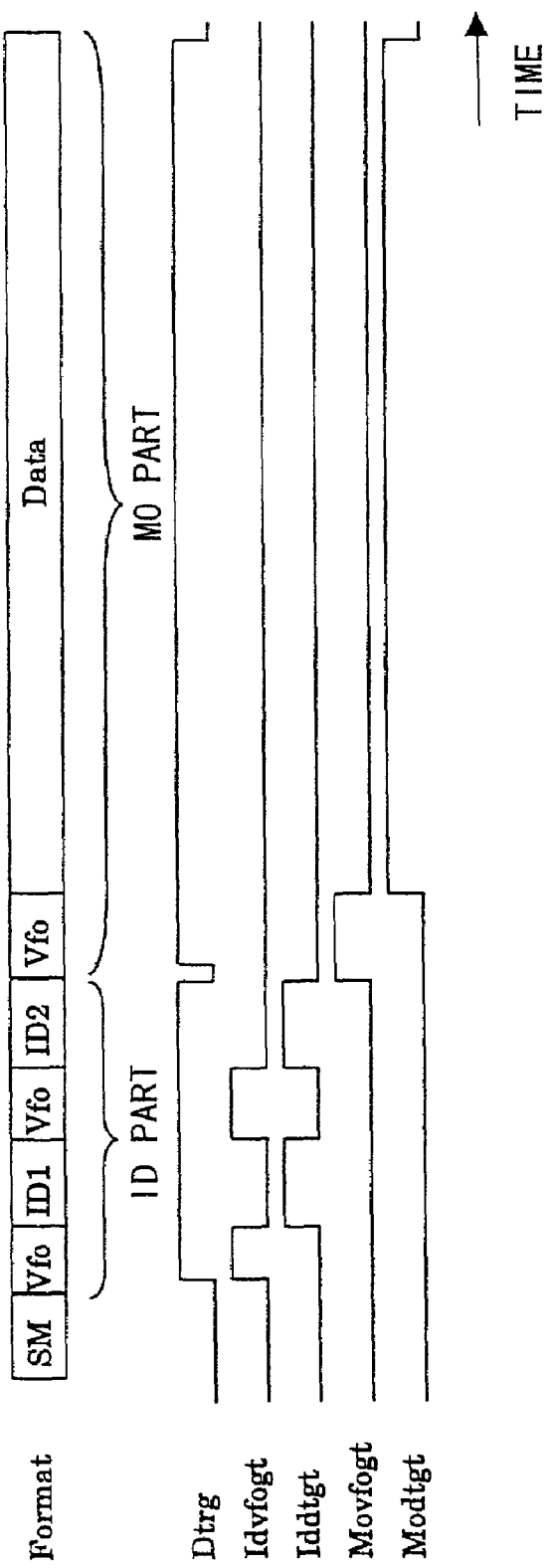
FIG. 18 is a diagram showing a data recording format of a magneto-optical disk (a recording medium) and timing gate signals corresponding to parts of a sector of the magneto-optical disk in conformity to the data recording format.

According to FIG. 18, each sector of the magneto-optical disk 10 includes an ID part and an MO part. The ID part, which is an area to which ID information is written, includes an ID1, an ID2, and two Vfos: one preceding the ID1 and the other preceding the ID2. The MO part, which is an area to which data is written, includes a Vfo and a Data part.

In reproducing data from the magneto-optical disk 10 on which the data is recorded in conformity to this format, the MPU generates timing gate signals corresponding to the parts. Specifically, the MPU generates the Dtrg signal representing a timing gate corresponding to the ID and MO parts, an Idvfogt signal representing the timing gates of the Vfos of the ID part, an Iddtgt signal representing the timing gates of the ID1 and ID2 of the ID part, a Movfogt signal representing the timing gate of the Vfo of the MO part, and a Modtgt signal representing the timing gate of the Data part of the MO part.

A measurement period for detecting a defect of the recorded data, that is, each of the count values (1) through (5) supplied to the defect detectors 33(1) through 33(5), respectively, can be varied for each of the parts of a recording area (that is, each of the Vfos, ID1, and ID2 of the ID part and the Vfo and the Data part of the MO part). Thereby, the capability of detecting the defect of the recorded data is adjustable for each part of the recording area. For instance, since the Vfo of the MO part is a densest pattern, the defect detection capability can be set higher for the Vfo of the MO part than for the Data part of the MO part by shortening each measurement period for defect detection, that is, by decreasing each of the count values (1) through (5).

In this case, MPU enables the timing gate of each part and outputs the count values (1) through (5) for an area corresponding to the timing gate. The signal representing the timing gate of each part and the corresponding count values (1) through (5) are supplied to the count value selector circuit 50 shown in FIG. 5.

Figure 19:
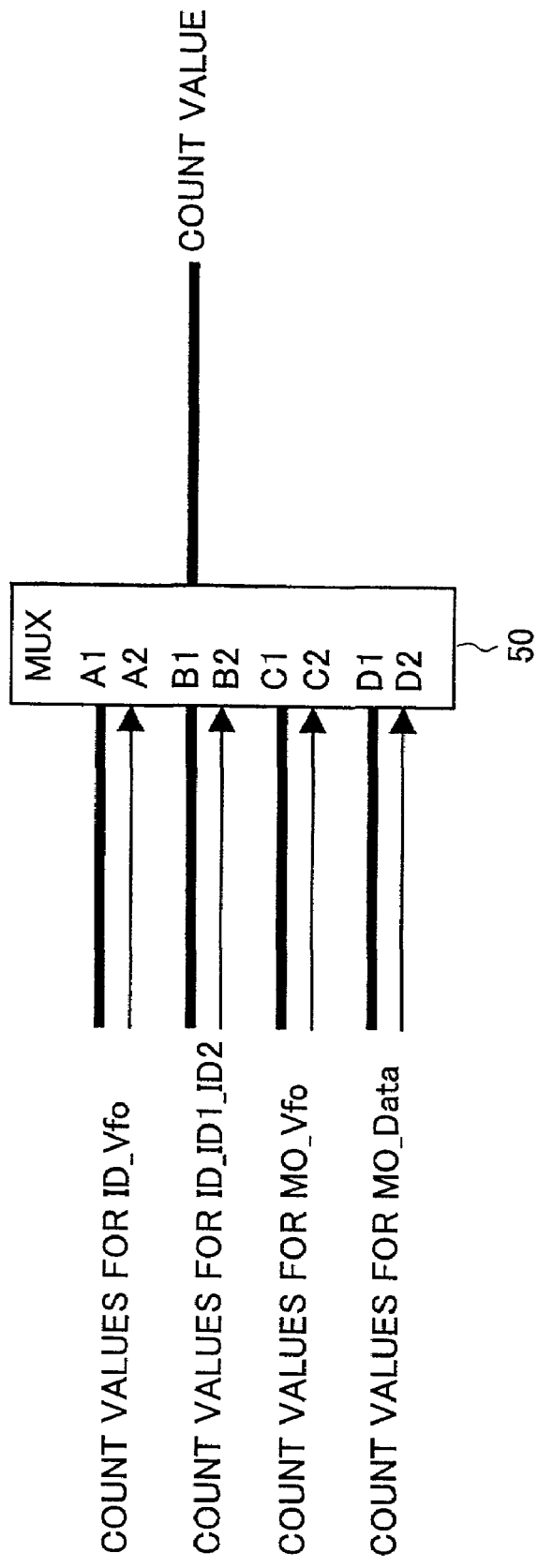
FIG. 19 is a diagram showing a structure of a count value selector circuit of the data reproduction apparatus of FIG. 5.

FIG. 19 is a diagram showing a structure of the count value selector circuit 50.

According to FIG. 19, the count value selector circuit 50 includes a multiplexer (MUX) having data input terminals A1, B1, C1, and D1 and selection control terminals A2, B2, C2, and D2. The count values (1) through (5) for the Vfos of the ID part are supplied to the data input terminal A1 and the Idvfogt signal representing the timing gates of the Vfos is input to the selection control terminal A2 paired with the data input terminal A1. The count values (1) through (5) for the ID1 and ID2 of the ID part are supplied to the data input terminal B1 and the Iddtgt signal representing the timing gates of the ID1 and ID2 is input to the selection control terminal B2 paired with the data input terminal B1. The count values (1) through (5) for the Vfo of the MO part are supplied to the data input terminal C1 and the Movfogt signal representing the timing gate of the Vfo is input to the selection control terminal C2 paired with the data input terminal C1. The count values (1) through (5) for the Data part of the MO part are supplied to the data input terminal D1 and the Modtgt signal representing the timing gate of the Data part is input to the selection control terminal D2 paired with the data input terminal D1.

When one of the above-described Idvfogt, Iddtgt, Movfogt, and Modtgt signals input to the selection control terminals A2, B2, C2, and D2, respectively, is made valid, the count value selector circuit 50 selects the count values (1) through (5) input to a corresponding one of the data input terminals A1, B1, C1, and D1. If the Idvfogt signal input to the selection control terminal A2 is made valid, for instance, the count value selector circuit 50 selects and outputs the count values (1) through (5) for the Vfos of the ID part supplied to the data input terminal A1 paired with the selection control terminal A2. Further, if the Iddtgt signal input to the selection control terminal B2 is made valid, the count value selector circuit 50 selects and outputs the count values (1) through (5) for the ID1 and ID2 of the ID part supplied to the data input terminal B1 paired with the selection control terminal B2.

By supplying with the count values (1) through (5) specific to each part of the recording area to the defect detectors 33(1) through 33(5), respectively, via the above-described count value selector circuit 50, the defect detection capability is adjustable for each part of the recording area.

In this case, each of the signals (Idvfogt, Iddtgt, Movfogt, and Modtgt) representing the timing gates of the parts of the recording area is input, for instance, via an OR circuit to the clear terminal (Xclr) of each of the counters 331, 334, 337, 341, and 345 of the defect detectors 33(1) through 33(5) as shown in FIGS. 8 through 12.

Figure 20:
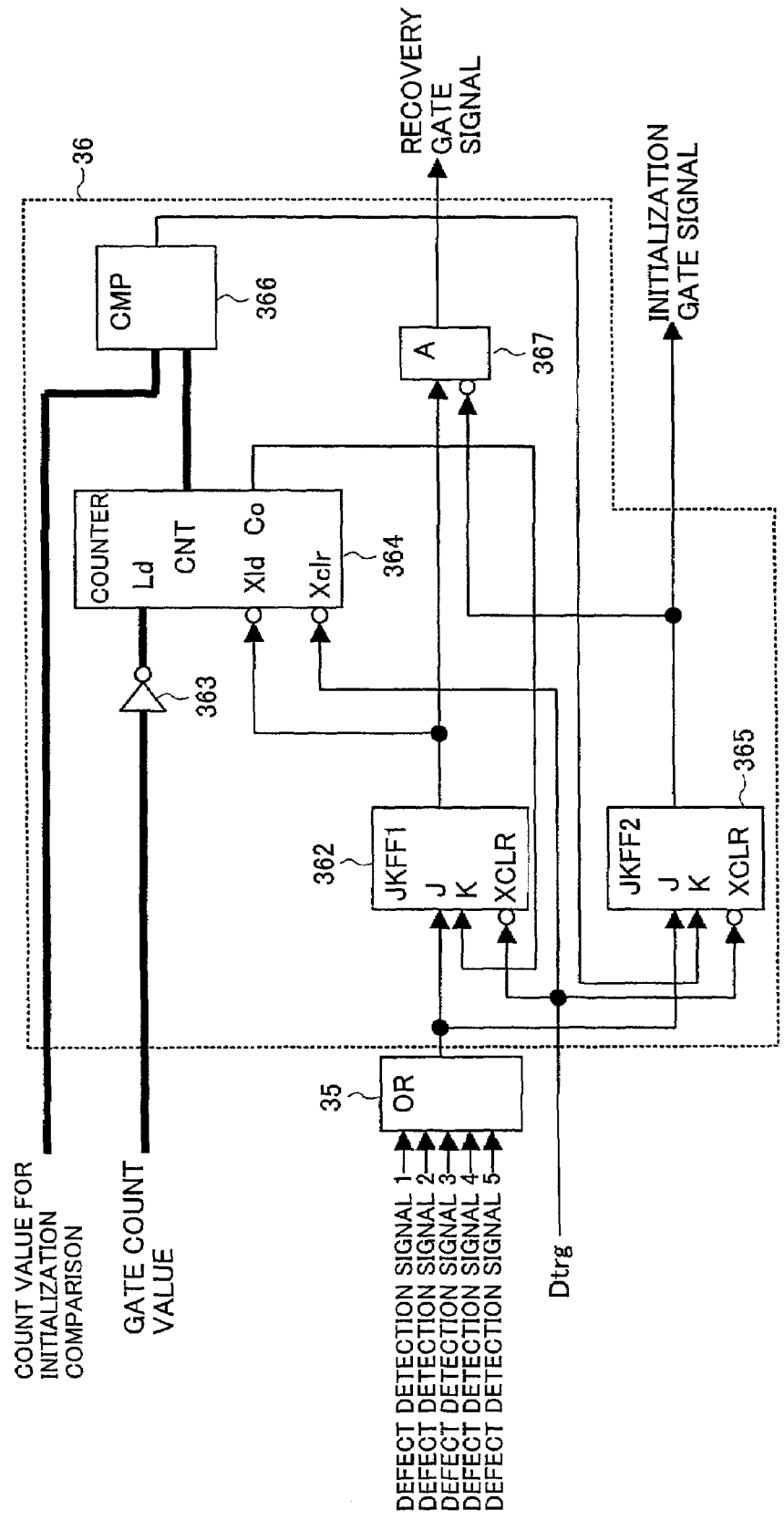
FIG. 20 is a block diagram showing a structure of a recovery gate signal generator of the defect detection part of FIG. 5.

Next, a description will be given of the recovery gate signal generator 36. FIG. 20 is a diagram showing a structure of the recovery gate signal generator 36.

According to FIG. 20, the recovery gate signal generator 36 includes a flip-flop (JKFF1) 362, a bit inverter circuit 363, a counter 364, a flip-flop (JKFF2) 365, a comparator 366, and an AND circuit 367. The defect detection signals 1 through 5 output from the defect detectors 33(1) through 33(5), respectively, are input to the OR circuit 35, and the output signal of the OR circuit 35 is input to the set input (J) of each of the flip-flops 362 and 365. A gate count value corresponding to a given period of time is supplied from the MPU via the bit inverter circuit 363 to the load value terminal (Ld) of the counter 364. That is, the complement value of the gate count value is supplied to the counter 364. The given period of time corresponding to the gate count value is determined based on a period of time for which a defect of the recorded data is expected to continue and a period of time required to cope with the defect of the recorded data. That is, it is during the given period of time that a later-described recovery operation is performed.

The output signal of the flip-flop 362 is supplied to the load control terminal (Xld) of the counter 364, and the Dtrg signal that rises at the start timing of each of the ID part and the MO part as shown in FIG. 18 is input to the clear terminal (Xclr) of the counter 364 and the clear terminal (XCLR) of each of the flip-flops 362 and 365. The counter 364 has the same function as the counters 331, 334, 337, 341, and 345 of the defect detectors 33(1) through 33(5) as shown in FIGS. 8 through 12. With the Dtrg signal being high, when the output signal of the flip-flop 362 rises, the complement value of the gate count value is loaded into the counter 364 so that the counter 364 performs a count operation. When the count operation for the gate count value is terminated, the counter 364 outputs a high-level signal from its output terminal (Co).

The high-level signal output from the output terminal (Co) is fed back to the reset input (K) of the flip-flop 362 so that the flip-flop 362 is reset when the signal output from the output terminal (Co) rises. As the flip-flop 362 is reset, the input signal to the load control terminal (Xld) of the counter 364 falls so that the signal output from the output terminal (Co) falls. Accordingly, the counter 364 outputs the pulse signal from the output terminal (Co) when the count operation for the gate count value is terminated.

On the other hand, a count value (CNT) corresponding to the count operation in the counter 364 and a count value for initialization gate comparison supplied from the MPU are compared in the comparator 366. The count value for initialization gate comparison is determined based on the period of time for which the defect of the recorded data is expected to continue. The comparator 366 outputs a comparison result signal that becomes valid (high) when the count value (CNT) reaches the count value for initialization gate comparison. The comparison result signal is fed back to the reset input (K) of the flip-flop 365 so that the flip-flop 365 is reset when the comparison result signal rises.

The output signal of the flip-flop 365 is output from the recovery gate signal generator 36 as the initialization gate signal. The output signal of the flip-flop 362 and the inverted output signal of the flip-flop 365 are input to the AND circuit 367 so that the output signal of the flip-flop 362 is masked by the output signal of the flip-flop 365 and output from the recovery gate signal generator 36 as the recovery gate signal.

According to the above-described structure, the recovery gate signal generator 36 operates in accordance with a timing chart shown in FIG. 21, for instance.

As shown in FIG. 21, with the Dtrg signal being high, every time the defect detection signal 1, for instance, is input to the flip-flops 362 and 365 from the defect detector 33(1) via the OR circuit 35, the output signals of the flip-flops 362 and 365 rise. The output signal of the flip-flop 365 is output from the recovery gate signal generator 36 as the initialization gate signal. With the initialization gate signal being high, the AND circuit 367 masks the output signal of the flip-flop 362.

When the count value (CNT) of the counter 364 reaches the count value for initialization gate comparison, the comparison result signal output from the comparator 366 rises so that the flip-flop 365 is reset. Then, with the initialization gate signal falling, a mask on the output signal of the flip-flop 362 is removed so that the recovery gate signal corresponding to the output signal of the flip-flop 362 rises.

Thereafter, the count value (CNT) continues to increase by the count operation in the counter 364. When the count value (CNT) reaches the gate count value, the flip-flop 362 is reset by the signal output from the output terminal (Co) of the counter 364. As a result, the recovery gate signal falls.

In the above-described process, every time one of the defect detection signals 1 through 5 output from the defect detectors 33 (1) through 33 (5), respectively, is input to the recovery gate signal generator 36, the recovery gate signal generator 36 outputs the initialization gate signal that is valid for the period of time for which the defect of the recorded data is expected to continue and the recovery gate signal that rises at a timing when the initialization gate signal falls (step S6 of FIG. 22B). The sum of the period of time for which the initialization gate signal is valid (high) (a given period of time) and a period of time for which the recovery gate signal is valid (high) (a subsequent given period of time) is equal to the given period of time corresponding to the gate count value.

The initialization gate signal and the recovery gate signal thus output from the recovery gate signal generator 36 are supplied to the adjuster 40 shown in FIG. 1. As previously described, the adjuster 40 controls the expected values used for the data demodulation in the ML detector 20 based on the variation level of the reproduced signal so that the expected values follow the variation in the reproduced signal. In performing such follow-up control of the expected values, during the period of time for which the input initialization gate signal is valid, the adjuster 40 cancels the control of the expected values based on the variation level of the reproduced signal and, for instance, fixes the expected values to initial values since it is expected that the defect of the recorded data continues to exist to prevent the reproduced signal from being properly obtained. In the case of controlling the offset amount for given expected values so that the offset amount follows the variation in the reproduced signal, the offset amount is fixed to zero during the period of time for which the initialization gate signal is valid.

During the period of time for which the recovery gate signal is valid after the initialization gate signal falls, a gain for the control of the expected values is increased so that the expected values can return to, or recover, values appropriate for the actual reproduced signal as quickly as possible. Thereafter, when the recovery gate signal falls, the adjuster returns the gain to its normal level and controls the expected values so that the expected values follow the variation in the reproduced signal.

As described above, when the defect of the recorded data is detected, the adjuster 40 fixes the expected values (or the offset amount thereof) to the initial values (or zero) during the period of time for which the initialization gate signal is valid, and after the recovery gate signal rises, from which it is expected that the defect is eliminated, controls the expected values (or the offset amount) with the increased gain for the control so that the expected values (or the offset amount) follow the variation in the reproduced signal (step S7 of FIG. 22B). Therefore, a decrease in data reading capacity resulting from the defect of the recorded data can be minimized.

The above-described function of the adjuster 40 based on the initialization gate signal supplied from the recovery gate signal generator 36 may be referred to as an initialization part of the data reproduction apparatus according to the present invention.

As described above, according to the present invention, soft decision results obtained in the process of reproducing data having maximum likelihood in accordance with the ML decoding algorithm reflect the state of the waveform of a reproduced signal, and a defect of recorded data appears as an abnormality in the reproduced signal. Therefore, the defect of the recorded data is determinable based on the soft decision results. Consequently, a defect detection device that can accurately detect the defect of the recorded data and a data reproduction apparatus including such a defect detection device can be realized.

The present invention is not limited to the specifically disclosed embodiment, but variations and modifications may be made without departing from the scope of the present invention.

The present application is based on Japanese priority application No. 2001-165590 filed on May 31, 2001, the entire contents of which are hereby incorporated by reference.

What is claimed is:

1. A defect detection device for detecting a defect of recorded data in a data reproduction apparatus for reproducing data having maximum likelihood as the recorded data in accordance with a maximum likelihood decoding algorithm corresponding to partial response, the data being reproduced from sampled values obtained by sampling a reproduced signal from a recording medium, the defect detection device comprising:

a waveform state detection part generating information representing a state of a waveform of the reproduced signal based on soft decision results obtained in process of reproducing the data; and a defect determination part determining the defect of the recorded data based on the information generated in said waveform state detection, wherein:

said waveform state detection part generates first information distinctively representing a first state corresponding to a peak value part of the sampled values and a second state corresponding to the other part of the sampled values than the peak value part and second information distinctively representing a third state corresponding to a bottom value part of the sampled values and a fourth state corresponding to the other part of the sampled values than the bottom value part; and said defect determination part determines the defect of the recorded data based on at least one of the first and second information.

2. The defect detection device as claimed in claim 1, wherein said defect determination part comprises a state continuation period measurement part measuring a period of continuation of at least one of the first through fourth states, and determines the defect of the recorded data when the period of continuation measured in said state continuation period measurement part reaches a given period of time.

3. The defect detection device as claimed in claim 2, wherein said state continuation period measurement part measures the period of continuation of the third state.

4. The defect detection device as claimed in claim 2, wherein said state continuation period measurement part measures the period of continuation of the first state.

5. The defect detection device as claimed in claim 2, wherein said state continuation period measurement part measures the period of continuation of the fourth state.

6. The defect detection device as claimed in claim 2, wherein said state continuation period measurement part measures the period of continuation of the second state.

7. The defect detection device as claimed in claim 2, wherein said state continuation period measurement part measures the periods of continuation of the second and fourth states.

8. The defect detection device as claimed in claim 2, further comprising a time setting part setting the given period of time.

9. The defect detection device as claimed in claim 8, wherein said time setting part includes a variation part setting the given period of time differently for each of parts of a recording area of the recording medium, the parts of the recording area being defined based on a data format.

10. A data reproduction apparatus for reproducing data having maximum likelihood as recorded data in accordance with a maximum likelihood decoding algorithm corresponding to partial response using a maximum likelihood detector, the data reproduction apparatus comprising:
   a follow-up control part controlling, based on a level of a variation in the reproduced signal, necessary information for reproducing the data so that the necessary information follows the variation in the reproduced signal;
   a defect detection part for detecting a defect of the recorded data; and
   an initialization part fixing the necessary information to an initial value for a given period of time when said defect detection part detects the defect of the recorded data,
   wherein said defect detection part comprises:
      a waveform state detection part generating information representing a state of a waveform of the reproduced signal based on soft decision results obtained from an add-compare-select part of the maximum likelihood detector in process of reproducing the data; and
      a defect determination part determining the defect of the recorded data based on the information generated in said waveform state detection part, wherein the waveform state detection part is directly connected to the add-compare-select part and the data being reproduced is from sampled values obtained by sampling a reproduced signal from a recording medium.

11. The data reproduction apparatus as claimed in claim 10, further comprising a part setting the given period of time.

12. A data reproduction apparatus for reproducing data having maximum likelihood as recorded data in accordance with a maximum likelihood decoding algorithm corresponding to partial response, the data being reproduced from sampled values obtained by sampling a reproduced signal from a recording medium, the data reproduction apparatus comprising:
   a follow-up control part controlling, based on a level of a variation in the reproduced signal, necessary information for reproducing the data so that the necessary information follows the variation in the reproduced signal;
   a defect detection part for detecting a defect of the recorded data; and
   an initialization part fixing the necessary information to an initial value for a given period of time when said defect detection part detects the defect of the recorded data,
   wherein said defect detection part comprises:
      a waveform state detection part generating information representing a state of a waveform of the reproduced signal based on soft decision results obtained in process of reproducing the data, and
      a defect determination part determining the defect of the recorded data based on the information generated in said waveform state detection part, and
   wherein said follow-up control part increases a gain for controlling the necessary information for a subsequent given period of time after the initialization part fixes the necessary information to the initial value for the given period of time.

13. The data reproduction apparatus as claimed in claim 12, further comprising a part setting the subsequent given period of time.

14. A defect detection device for detecting a defect of data recorded on a recording medium, the defect detection device comprising:
   a first part generating information representing a state of a waveform of a reproduced signal from the recording medium based on soft decision results obtained in process of reproducing the data in accordance with a maximum likelihood decoding algorithm corresponding to partial response; and
   a second part determining the defect of the recorded data based on the information generated in said first part, wherein:
   the first part generates a first signal switching between a first level corresponding to a peak value part of sampled values obtained from the reproduced signal and a second level corresponding to the other part of the sampled values than the peak value part and a second signal switching between a third level corresponding to a bottom value part of the sampled values and a fourth level corresponding to the other part of the sampled values than the bottom value part; and
   said second part determines the defect of the recorded data based on at least one of the first and second signal.

15. The defect detection device as claimed in claim 14, wherein said second part comprises a third part measuring a period of continuation of at least one of the first through fourth levels, and determines the defect of the recorded data when the period of continuation measured in said third part reaches a given period of time.

16. The defect detection device as claimed in claim 15, wherein said third part measures the period of continuation of the third level.

17. The defect detection device as claimed in claim 15, wherein said third part measures the period of continuation of the first level.

18. The defect detection device as claimed in claim 15, wherein said third part measures the period of continuation of the fourth level.

19. The defect detection device as claimed in claim 15, wherein said third part measures the period of continuation of the second level.

20. The defect detection device as claimed in claim 15, wherein said third part measures the periods of continuation of the second and fourth levels.

21. The defect detection device as claimed in claim 15, further comprising a fourth part setting the given period of time.

22. The defect detection device as claimed in claim 21, wherein said fourth part includes a fifth part setting the given period of time differently for each of parts of a recording area of the recording medium, the parts of the recording area being defined based on a data format.

23. A data reproduction apparatus comprising:
   a defect detection part detecting a defect of data recorded on a recording medium, the defect detection part comprising:

a first part generating information representing a state of a waveform of a reproduced signal from the recording medium directly from soft decision results obtained in process of reproducing the data in accordance with a maximum likelihood decoding algorithm corresponding to partial response, and a second part determining the defect of the recorded data based on the information generated in said first part;

a control part controlling, based on a level of a variation in the reproduced signal, necessary information for reproducing the data so that the necessary information follows the variation in the reproduced signal; and an initialization part fixing the necessary information to an initial value for a given period of time when said defect detection part detects the defect of the recorded data.

24. The data reproduction apparatus as claimed in claim 23, wherein said control part increases a gain for controlling the necessary information for a subsequent given period of time after the initialization part fixes the necessary information to the initial value for the given period of time.

25. The data reproduction apparatus as claimed in claim 24, further comprising a part setting the subsequent given period of time.

26. The data reproduction apparatus as claimed in claim 23, further comprising a part setting the given period of time.

27. The data reproduction apparatus as claimed in claim 23, wherein the necessary information is expected values for the reproduced signal.

28. The data reproduction apparatus as claimed in claim 23, wherein the necessary information is an offset amount for expected values for the reproduced signal.

29. The data reproduction apparatus as claimed in claim 23, wherein the necessary information is sampled values obtained from the reproduced signal.

30. A method of detecting a defect of data recorded on a recording medium, the method comprising the steps of:
  (a) obtaining soft decision results obtained in process of reproducing the data in accordance with a maximum likelihood decoding algorithm corresponding to partial response;
  (b) generating information representing a state of a waveform of a reproduced signal from the recording medium based on the soft decision results obtained in said step (a); and
  (c) determining the defect of the recorded data based on the information obtained in said step (b), wherein:
  said step (b) generates a first signal switching between a first level corresponding to a peak value part of sampled values obtained from the reproduced signal and a second level corresponding to the other part of the sampled values than the peak value part and a second signal switching between a third level corresponding to a bottom value part of the sampled values and a fourth level corresponding to the other part of the sampled values than the bottom value part; and
  said step (c) determines the defect of the recorded data based on at least one of the first and second signal.

31. The method as claimed in claim 30, wherein said step (c) comprises the step of (d) measuring a period of continuation of at least one of the first through fourth levels, and determines the defect of the recorded data when the period of continuation measured in said step (d) reaches a given period of time.

32. The method as claimed in claim 31, wherein said step (d) measures the period of continuation of the third level.

33. The method as claimed in claim 31, wherein said step (d) measures the period of continuation of the first level.

34. The method as claimed in claim 31, wherein said step (d) measures the period of continuation of the fourth level.

35. The method as claimed in claim 31, wherein said step (d) measures the period of continuation of the second level.

36. The method as claimed in claim 31, wherein said step (d) measures the periods of continuation of the second and fourth levels.

37. The method as claimed in claim 31, further comprising the step of (e) setting the given period of time.

38. The method as claimed in claim 37, wherein said step (e) sets the given period of time differently for each of parts of a recording area of the recording medium, the parts of the recording area being defined based on a data format.

39. A method of reproducing data from a recording medium, comprising:
  sampling a reproduced signal from the recording medium;
  detecting a defect of data recorded on a recording medium;
  fixing necessary information for reproducing the data to an initial value for a given period of time when said detecting detects the defect of the recorded data;
  controlling the necessary information based on a level of a variation in the reproduced signal so that the necessary information follows the variation in the reproduced signal;
  generating information representing a state of a waveform of the reproduced signal from the recording medium directly from soft decision outputs from an add-compare-select part of a maximum likelihood detector in process of reproducing the data in accordance with a maximum likelihood decoding algorithm corresponding to partial response; and
  determining the defect of the recorded data based on the information generated.

40. The method as claimed in claim 39, further comprising setting the given period of time.

41. The method as claimed in claim 39, wherein the necessary information is expected values for the reproduced signal.

42. The method as claimed in claim 39, wherein the necessary information is an offset amount for expected values for the reproduced signal.

43. The method as claimed in claim 39, wherein the necessary information is sampled values obtained from the reproduced signal.

44. A method of reproducing data from a recording medium, comprising the steps of:
  (a) detecting a defect of data recorded on a recording medium;
  (b) fixing necessary information for reproducing the data to an initial value for a given period of time when said step (a) detects the defect of the recorded data; and
  (c) controlling the necessary information based on a level of a variation in the reproduced signal so that the necessary information follows the variation in the reproduced signal,
  wherein said step (c) increases a gain for controlling the necessary information for a subsequent given period of time after said step (b) fixes the necessary information to the initial value for the given period of time.

45. The method as claimed in claim 44, further comprising the step of (d) setting the subsequent given period of time.

* * * * *